(12) United States Patent
Chen

(10) Patent No.: US 11,428,861 B2
(45) Date of Patent: Aug. 30, 2022

(54) BACKLIGHT MODULE AND INPUT APPARATUS

(71) Applicants: LITE-ON ELECTRONICS (GUANGZHOU) LIMITED, Guangzhou (CN); Lite-On Technology Corporation, Taipei (TW)

(72) Inventor: Yi-Wen Chen, Taipei (TW)

(73) Assignees: LITE-ON ELECTRONICS (GUANGZHOU) LIMITED, Guangzhou (CN); Lite-On Technology Corporation, Taipei (TW)

( * ) Notice: Subject to any disclaimer, the term of this patent is extended or adjusted under 35 U.S.C. 154(b) by 0 days.

(21) Appl. No.: 17/167,045

(22) Filed: Feb. 3, 2021

(65) Prior Publication Data

US 2021/0157045 A1 May 27, 2021

Related U.S. Application Data

(63) Continuation-in-part of application No. 16/524,187, filed on Jul. 29, 2019, now Pat. No. 10,942,309.
(Continued)

(30) Foreign Application Priority Data

Dec. 7, 2018 (CN) .......................... 201811493155.8

(51) Int. Cl.
*F21V 8/00* (2006.01)
*G06F 1/16* (2006.01)
(Continued)

(52) U.S. Cl.
CPC .......... *G02B 6/0055* (2013.01); *G06F 1/169* (2013.01); *G06F 3/0213* (2013.01); *H01H 13/14* (2013.01);
(Continued)

(58) Field of Classification Search
CPC ..... G02B 6/0055; G02B 6/0088; G06F 1/169; G06F 3/0213; G06F 3/0202;
(Continued)

(56) References Cited

U.S. PATENT DOCUMENTS 5,397,867 A * 3/1995 Demeo ................ G02B 6/0043
200/311
5,867,772 A * 2/1999 Jonsson .............. H04M 1/0249
455/575.1
(Continued)

*Primary Examiner* — Peggy A Neils
(74) *Attorney, Agent, or Firm* — JCIPRNET

(57) ABSTRACT

A backlight module includes a reflection layer, a light guide plate and a mask layer. The light guide plate is disposed on the reflection layer and includes a light guide body, a first and a second opening structures. The first opening structure including a first closed end, the first closed end has two first branches. The second opening structure includes a second closed end, the first closed end and the second closed end face each other, at least one of the two first branches of the first closed end partially overlaps the second closed end along a first axis, the two first branches are located on two sides of the second closed end along a second axis, and the first axis is perpendicular to the second axis. The light guide plate is disposed between the reflection layer and the mask layer.

20 Claims, 18 Drawing Sheets

Related U.S. Application Data

(60) Provisional application No. 62/712,993, filed on Aug. 1, 2018.

(51) Int. Cl.
*H01H 13/14* (2006.01)
*H01H 13/83* (2006.01)
*G06F 3/02* (2006.01)

(52) U.S. Cl.
CPC ......... *H01H 13/83* (2013.01); *H01H 2219/06* (2013.01)

(58) Field of Classification Search
CPC ...... G06F 1/1662; H01H 13/14; H01H 13/83; H01H 2219/06; H01H 2219/062; H03K 17/967; F21V 33/0052
See application file for complete search history.

(56) References Cited

U.S. PATENT DOCUMENTS

| | | | | |
|---|---|---|---|---|
| 7,543,971 B2 * | 6/2009 | Lee | ...................... | G02B 6/0018 362/23.19 |
| 10,942,309 B2 * | 3/2021 | Chiu | ....................... | H01H 13/83 |
| 2015/0332874 A1 * | 11/2015 | Brock | .................... | H01H 13/83 200/5 A |

* cited by examiner

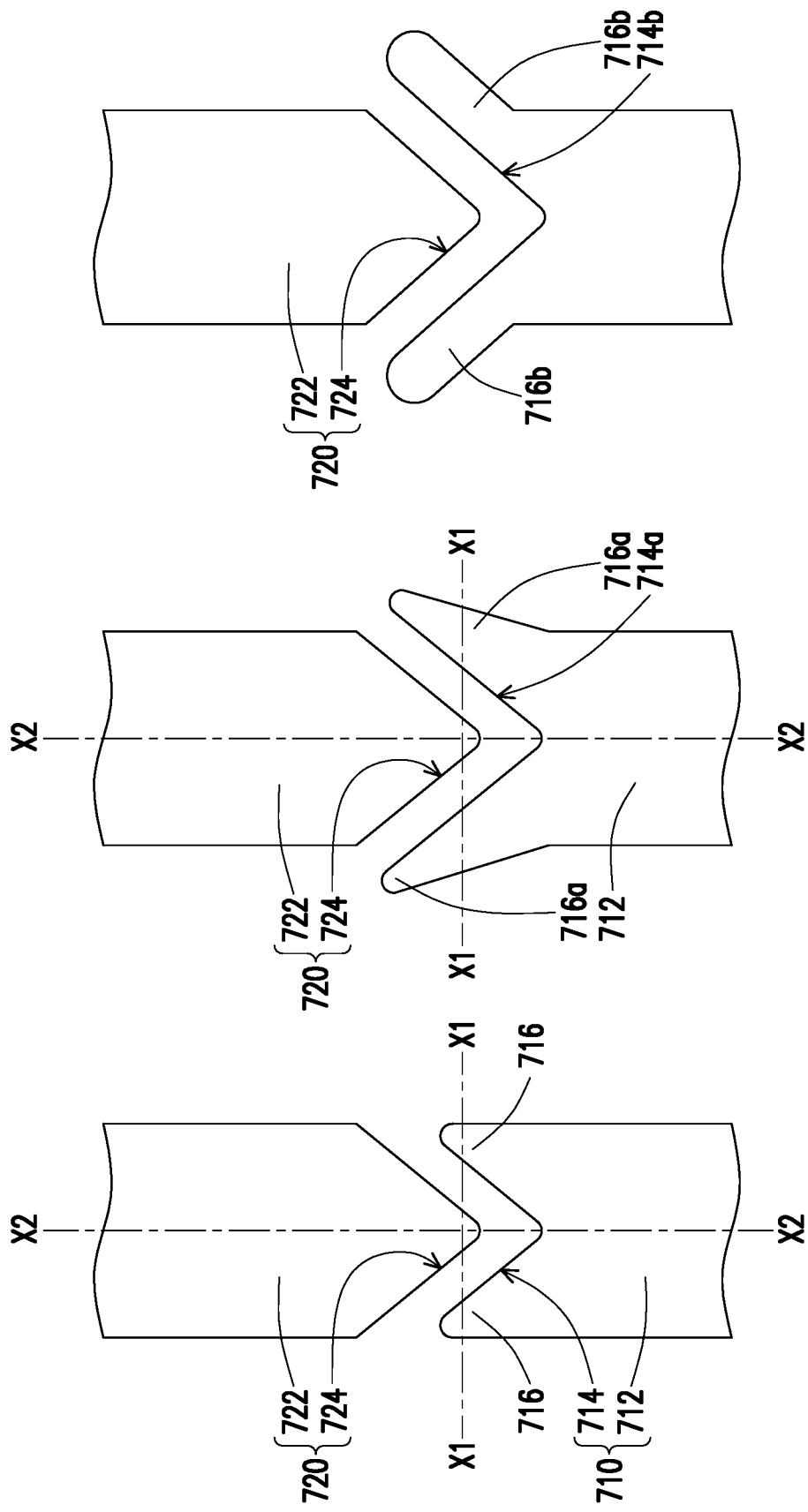

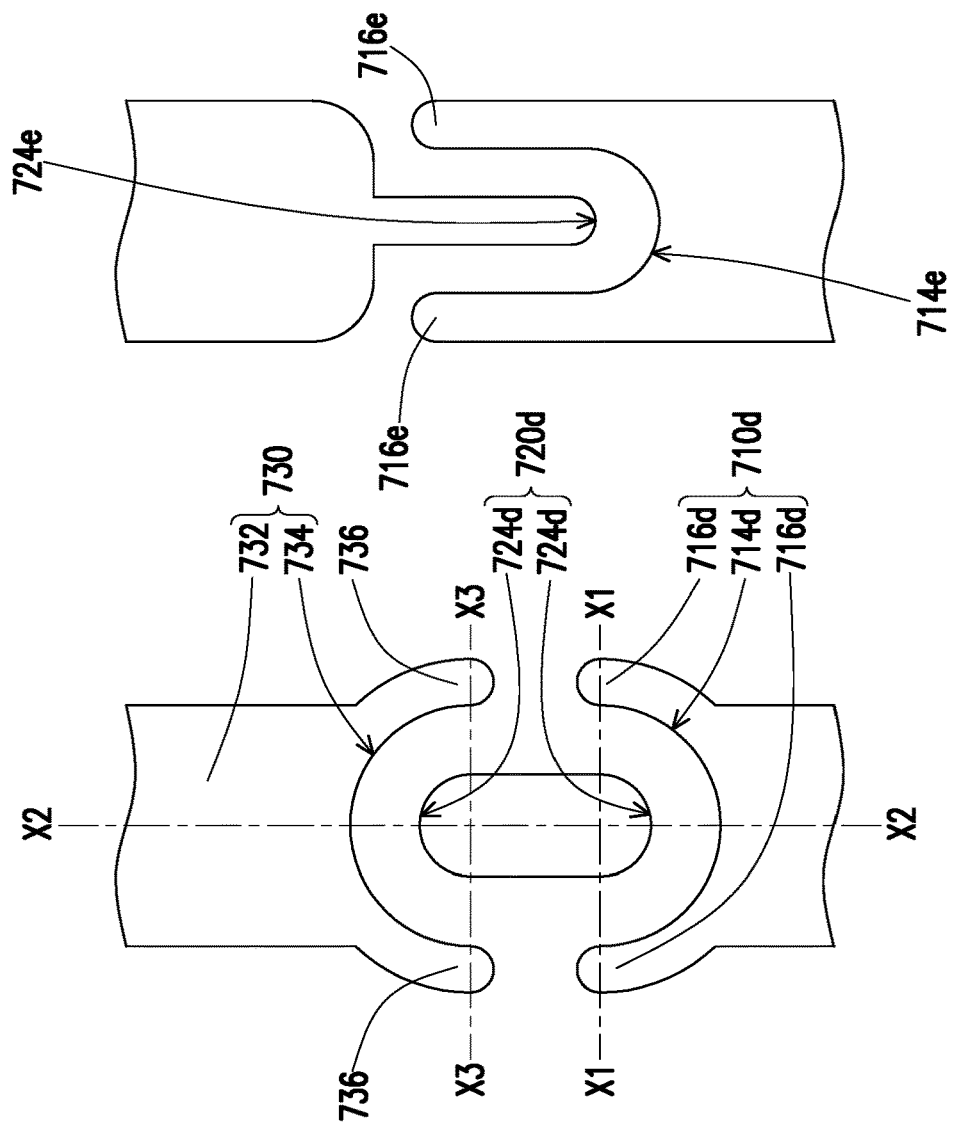
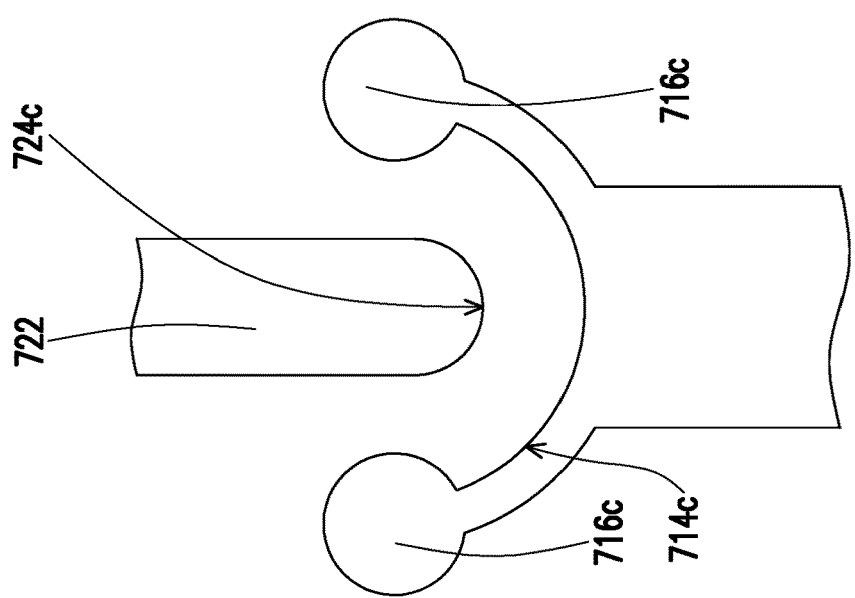
FIG. 3G
FIG. 3F
FIG. 3E

BACKLIGHT MODULE AND INPUT APPARATUS

CROSS-REFERENCE TO RELATED APPLICATION

This application is a continuation-in-part application of and claims the priority benefit of U.S. application Ser. No. 16/524,187, filed on Jul. 29, 2019, now allowed. The prior U.S. application Ser. No. 16/524,187 claims the priority benefits of U.S. provisional application Ser. No. 62/712,993, filed on Aug. 1, 2018, and China application serial no. 201811493155.8, filed on Dec. 7, 2018. The entirety of each of the above-mentioned patent applications is hereby incorporated by reference herein and made a part of this specification.

BACKGROUND OF THE INVENTION

1. Field of the Invention

The present invention relates to a backlight module and an input apparatus, and in particular, to a backlight module with a single-sheet light guide plate and an input apparatus using the foregoing light guide plate.

2. Description of Related Art

Light guide plates currently applied to keyboard modules may be classified into multi-sheet assembled light guide plates and single-sheet light guide plate. The multi-sheet assembled light guide plates have an advantage of preventing a light mixing phenomenon occurring in two neighboring regions with different colors. However, the disadvantages are that assembling of the multi-sheet assembled light guide plates is relatively difficult and costs are high. The single-sheet light guide plate does not need to be assembled, but a disadvantage is that no divided regions are disposed thereon, and therefore light in two neighboring regions with different colors is likely to be mixed. Therefore, how to make a light guide plate have an advantage that light exists in different regions with different colors at low costs already becomes one of important subjects.

SUMMARY OF THE INVENTION

The present invention provides a backlight module having a light guide plate with a single-sheet structure, to achieve an effect that the divided regions are achieved by disposing a plurality of opening structures.

The present invention further provides an input apparatus, including the foregoing light guide plate, so as to avoid a light mixing phenomenon occurring in two neighboring light guide regions.

The present invention provides a backlight module, includes a reflection layer, a light guide plate and a mask layer. The light guide plate is disposed on the reflection layer and includes a light guide body, a first opening structure and a second opening structure. The first opening structure passes through the light guide body and including a first closed end, wherein the first closed end has two first branches. The second opening structure passes through the light guide body and includes a second closed end, wherein the first closed end and the second closed end face each other, at least one of the two first branches of the first closed end partially overlaps the second closed end along a first axis, the two first branches of the first closed end are located on two sides of the second closed end along a second axis, and the first axis is substantially perpendicular to the second axis. The light guide plate is disposed between the reflection layer and the mask layer.

The present invention provides an input apparatus, includes a keycap layer, a light guide plate and a light source. The light guide plate is disposed below the keycap layer and includes a light guide body, a first opening structure and a second opening structure. The light guide body includes two light guide regions. The first opening structure passes through the light guide body and includes a first closed end. The second opening structure passes through the light guide body and includes a second closed end, wherein the first opening structure and the second opening structure are disposed between the two light guide regions and spaced apart from each other corresponding to positions between two adjacent keycaps of the keycap layer, the first closed end and the second closed end face each other, the first closed end partially overlaps the second closed end along a first axis, the first closed end and the second closed end are disposed along a second axis, and the first axis is substantially perpendicular to the second axis. The light source is disposed beside a side of the light guide plate.

The present invention provides an input apparatus, including a keycap layer, a reflection layer and a light guide plate. The reflection layer is disposed below the keycap layer. The light guide plate is disposed between the keycap layer and the reflection layer, wherein the light guide plate includes a first light guide region, a second light guide region, a first opening structure and a second opening structure. The second light guide region is partially connected with the first light guide region. The first opening structure is disposed between the first light guide region and the second light guide region, and includes a first extending portion and a first closed end connected to the first extending portion. The second opening structure is disposed between the first light guide region and the second light guide region, and comprising a second extending portion and a second closed end connected to the second extending portion, wherein the first closed end facing the second closed end extends toward the second extending portion.

Based on the foregoing descriptions, the light guide plate of the backlight module in the present invention is a single-sheet light guide plate and achieves, by disposing a plurality of opening structures, an effect that regions are divided into. In addition, the opening structures in the present invention include closed ends such that the light is refracted and reflected thereby. Therefore, when the light in the light guide plate of the input apparatus in the present invention is incident to the closed ends of the opening structures, the light is reflected or totally reflected by the closed ends of the opening structures, and so that light is not mixed in neighboring light guide regions, and the neighboring light guide regions can be performed in different colors.

To make the aforementioned and other objectives and advantages of the present invention comprehensible, embodiments accompanied with figures are described in detail below.

BRIEF DESCRIPTION OF THE DRAWINGS

Accompany drawings are included to further understand the present invention, and the accompanying drawings are incorporated and constitute a part of this specification. The accompanying drawings describe embodiments of the present invention, and are used to explain the principle of the present invention together with descriptions.

FIG. 2I is a schematic top view of a light guide plate according to another embodiment of the present invention.

FIGS. 3B-3F are partially enlarged schematic views of Z1-Z5 of FIG. 3A.

FIGS. 3G-3I are partially enlarged schematic views of a light guide plate according to another embodiments of the present invention.

DESCRIPTION OF THE EMBODIMENTS

Figure 1A:
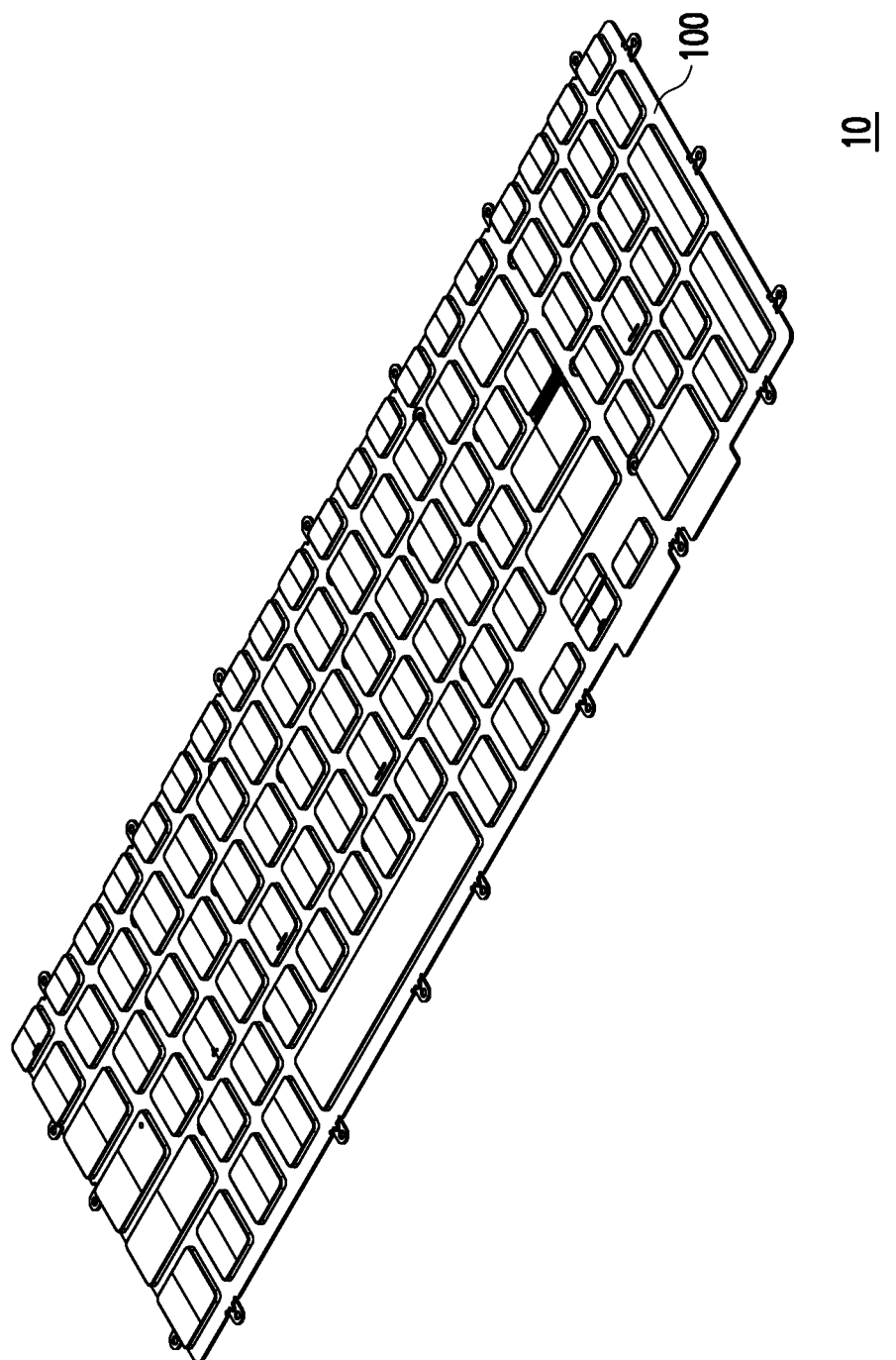
FIG. 1A is a schematic three-dimensional diagram of an input apparatus according to an embodiment of the present invention.

Examples of exemplary embodiments are described in the accompany drawings with reference to the exemplary embodiments of the present invention in detail. As long as possible, a same element numeral is used to represent a same or similar part in the drawings and descriptions.

Figure 1B:
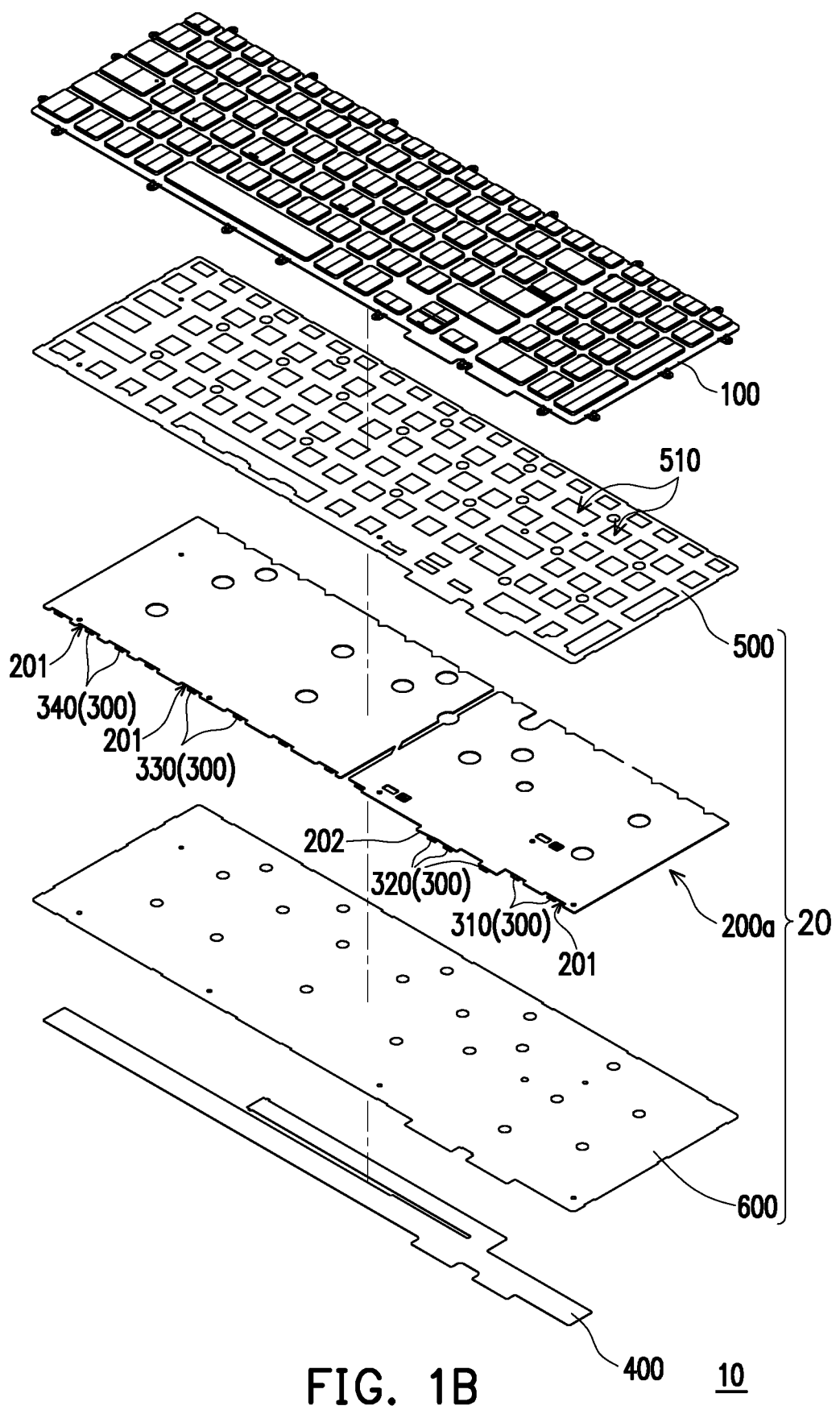
FIG. 1B is a schematic three-dimensional exploded view of the input apparatus in FIG. 1A.
Figure 2A:
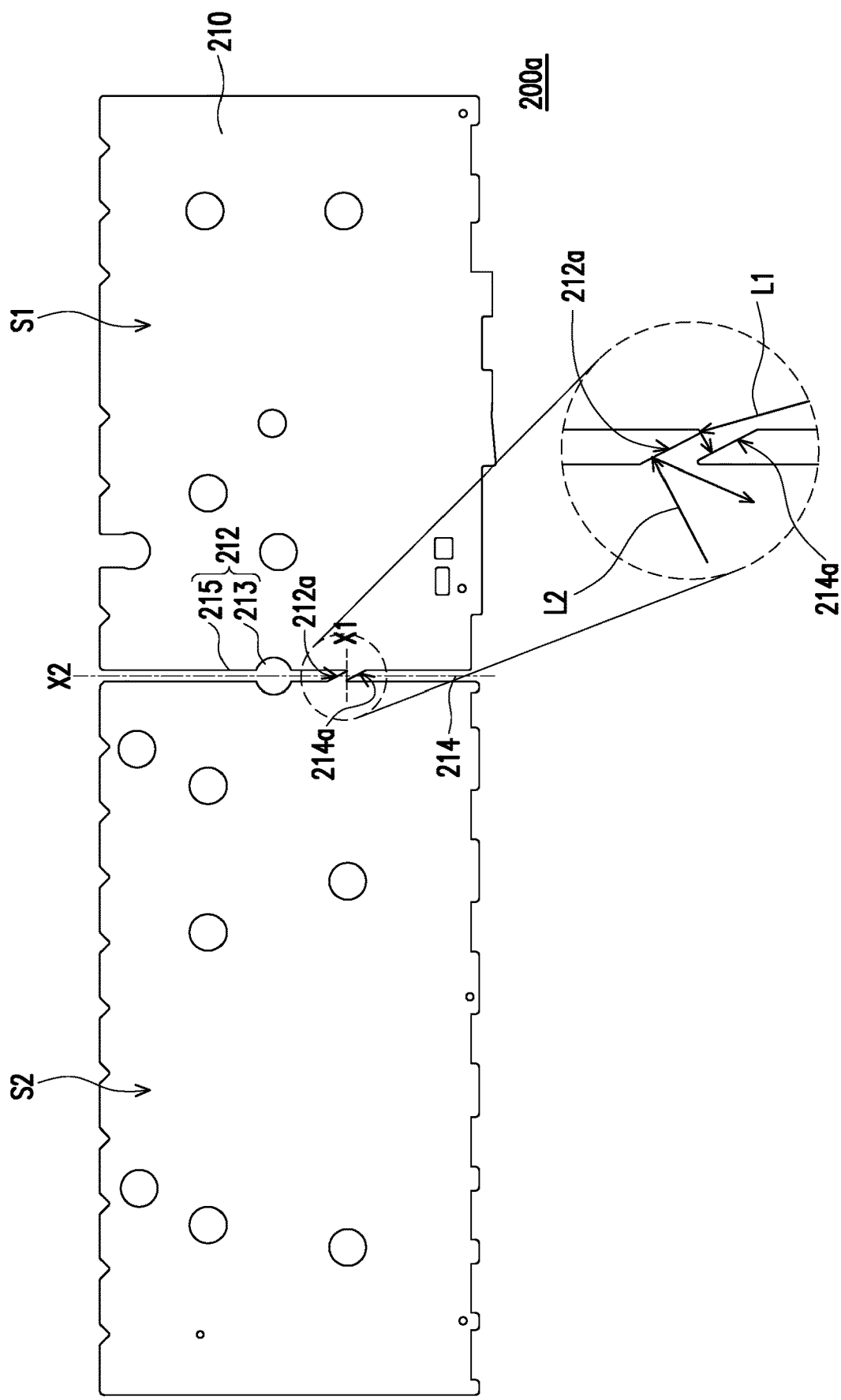
FIG. 2A is a schematic top view of a light guide plate of the input apparatus in FIG. 1A.

FIG. 1A is a schematic three-dimensional diagram of an input apparatus according to an embodiment of the present invention. FIG. 1B is a schematic three-dimensional exploded view of the input apparatus in FIG. 1A. FIG. 2A is a schematic top view of a light guide plate of the input apparatus in FIG. 1A. First referring to FIG. 1A, FIG. 1B, and FIG. 2A together. In this embodiment, an input apparatus 10 includes a keycap layer 100, a light guide plate 200a, a light source 300, and a circuit board 400. The light guide plate 200a is disposed below the keycap layer 100, and the light guide plate 200a includes a light guide body 210, at least one first opening structure 212 (where only one first opening structure 212 is schematically drawn in FIG. 2A), and at least one second opening structure 214 (where only one second opening structure 214 is schematically drawn in FIG. 2A). The first opening structure 212 passes through the light guide body 210 and includes at least one first closed end 212a (where only one first closed end 212a is schematically drawn in FIG. 2A). The second opening structure 214 passes through the light guide body 210 and includes at least one second closed end 214a (where only one second closed end 214a is schematically drawn in FIG. 2A). The first opening structure 212 and the second opening structure 214 are separated from each other to divide the light guide body 210 into at least two light guide regions S1 and S2 (where only two light guide regions are schematically drawn in FIG. 2A). The first closed end 212a and the second closed end 214a face each other and are suitable for refracting and reflecting light. The first closed end 212a partially overlaps the second closed end 214a on at least one first axis X1, the first closed end 212a and the second closed end 214a are disposed parallel to each other on at least one second axis X2, and the second axis X2 is perpendicular to the first axis X1. The light source 300 is disposed beside a side of the light guide plate 200a, and the circuit board 400 is disposed below the light guide plate 200a. The light source 300 is electrically connected to the circuit board 400.

Further, the input apparatus 10 in this embodiment is specifically a light emitting keyboard module, and the light guide plate 200a is specifically a single-sheet light guide plate. The first opening structure 212 and the second opening structure 214 are disposed to divide the light guide body 210 into the at least two light guide regions S1 and S2. As shown in FIG. 2A, a shape of the first closed end 212a of the first opening structure 212 and a shape of the second closed end 214a of the second opening structure 214 are the same. The shapes are an oblique surface, but not limited thereto. When the light source 300 emits light L1 and the light L2, the light L1 and the light L2 are incident to the light guide body 210, and is reflected or refracted by the first closed end 212a and the second closed end 214a, so that the light guide regions S1 and S2 are displayed in different colors. When incident angles of the light L1 and the light L2 are less than a critical angle, the light L1 and the light L2 may be alternatively totally reflected by the first closed end 212a and the second closed end 214a. Preferably, the first closed end 212a partially overlaps the second closed end 214a on the first axis X1. This can effectively reflect or totally reflect the light L1 to prevent the light L1 from entering the light guide region S2, and effectively reflect or totally reflect the light L2 to prevent the light L2 from entering the light guide region S1. Therefore, a light mixing phenomenon does not occur in the two neighboring light guide regions S1 and S2. As shown in FIG. 2A, the first closed end 212a and the second closed end 214a are disposed along the second axis X2. That is, the first closed end 212a and the second closed end 214a are parallel to each other on the second axis X2.

In addition, referring to FIG. 1B again, the input apparatus 10 in this embodiment further includes a mask layer 500, disposed between the keycap layer 100 and the light guide plate 200a. Light emitted by the light source 300 is transmitted in the light guide plate 200a, and is emitted from an opening 510 of the mask layer 500 to illuminate the keycap layer 100. In addition, the input apparatus 10 in this embodiment further includes a reflection layer 600, disposed below the light guide plate 200a and located between the light guide plate 200a and the circuit board 400, to reflect the light emitted by the light source 300. That is, the reflection layer 600 may reflect the light back to the light guide plate 200a, to improve utilization of the light source 300. A backlight module 20 of the input apparatus 10 includes light source 300, the light guide plate 200a, the reflection layer 600 and the mask layer 500. The light guide plate 200a is disposed between the reflection layer 600 and the mask layer 500. Herein, the light source 300 includes a plurality of light emitting diodes 310, 320, 330, and 340, and the light emitting diodes 310, 320, 330, and 340 respectively correspond to the light guide regions S1 and S2, and the light emitting diodes 310, 320, 330, and 340 are disposed beside of the side of the light guide 200a. The light emitting diodes 310, 320, 330, and 340 may be, for example, red light emitting diodes, blue light emitting diodes, or green light emitting diodes, but are not limited thereto. In other words, the light emitting diodes 310 and 320 in a same color correspond to the light guide region S1, and the light emitting diodes 330 and 340 in a same color correspond to the light guide region S2. By using design of the first closed end 212a of the first opening structure 212 and the second closed end 214a of the second opening structure 214, an effect that regions are divided into and light is not mixed can be achieved. In this embodiment, the side of the light guide plate 200a comprises a plurality of recesses 201 and two protrusions 202, and the light emitting diodes 320 are disposed beside the protrusions 202 of the side of the light guide plate 200a, and the light emitting diodes 310, 330, and 340 are disposed beside the recesses 201 of the side of the light guide plate 200a.

In particular, referring to FIG. 1B and FIG. 2A again, the first opening structure 212 includes a circular portion 213 and an extending portion 215 extending from the circular portion 213. A post (not shown in figures) is able to be disposed through the circular portion 213, and the post can be a screw boss, a hot melting pillar and so on, but the present invention is not limited thereto. In this embodiment, no part of the mask layer 500 and no part of the reflection layer 600 extend into the extending portion 215 of the first opening structure 212. In other words, there is no opaque material disposed within the first closed end 212a of the first opening structure 212. In other embodiment not shown, the second opening structure may include a circular portion and an extending portion, and no part of the mask layer and no part of the reflection layer extend into the extending portion of the second opening structure, which shall fall within the protection scope of the present invention.

In short, in design of the light guide plate 200a in this embodiment, the first opening structure 212 and the second opening structure 214 are separated from each other to divide the light guide body 210 into the light guide regions S1 and S2. That is, the light guide plate 200a in this embodiment is specifically a single-sheet light guide plate, and achieves, by disposing of the first opening structure 212 and the second opening structure 214, an effect that regions are divided into. In addition, the first opening structure 212 and the second opening structure 214 in this embodiment respectively include the first closed end 212a and the second closed end 214a that can refract and reflect light. Therefore, the input apparatus 10 using the light guide plate 200a in this embodiment can reflect or totally reflect light when the light source 300 is incident to the first closed end 212a and the second closed end 214a, so that the neighboring light guide regions S1 and S2 can be displayed in different colors, and a light mixing phenomenon is prevented.

It should be noted herein that element numerals and partial content of the foregoing embodiment are still used in the following embodiments. Same numerals are used to represent same or similar elements, and descriptions of same technical content are omitted. For descriptions of the omitted part, reference may be made to the foregoing embodiment. Details are not described in the following embodiments again.

Figure 2B:
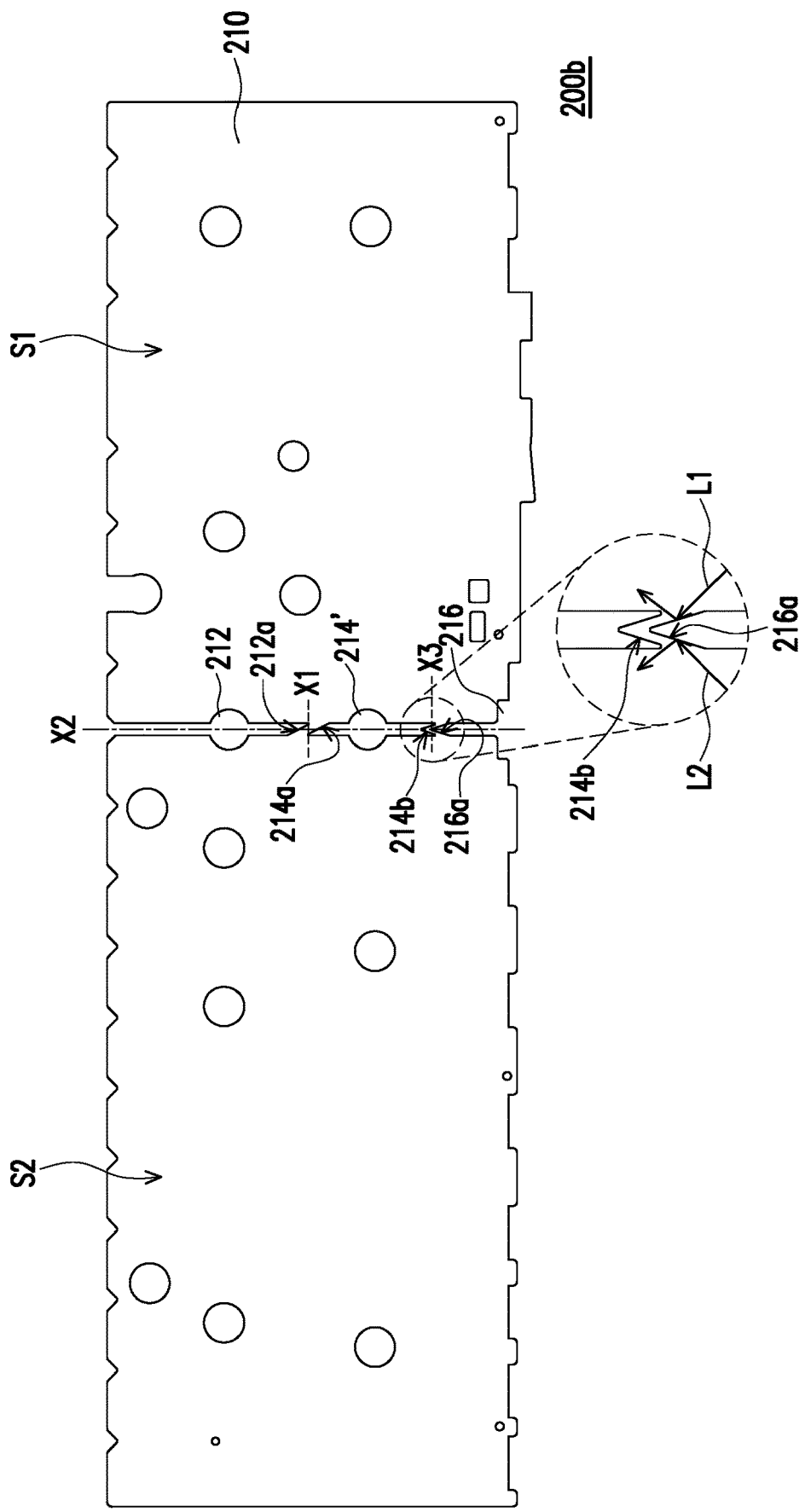
FIG. 2B is a schematic top view of a light guide plate according to an embodiment of the present invention.

FIG. 2B is a schematic top view of a light guide plate according to an embodiment of the present invention. Referring to both FIG. 2A and FIG. 2B, a light guide plate 200b in this embodiment is similar to the light guide plate 200a in FIG. 2A. A main difference between the light guide plate 200b and the light guide plate 200a lies in that the light guide plate 200b in this embodiment further includes at least one third opening structure 216 (where only one third opening structure 216 is schematically drawn in FIG. 2B), passing through the light guide body 210 and including at least one third closed end 216a (where only one third closed end 216a is schematically drawn in FIG. 2B). A second opening structure 214' further includes at least one fourth closed end 214b (where only one fourth closed end 214b is schematically drawn in FIG. 2B). The fourth closed end 214b is disposed parallel to the third closed end 216a on a second axis X2, the third closed end 216a partially overlaps the fourth closed end 214b on at least one third axis X3 (where only one third axis X3 is schematically drawn in FIG. 2B), and a first axis X1 is parallel to the third axis X3. The second closed end 214a and the fourth closed end 214b are respectively located at two ends of the second opening structure 214, and the first closed end 212a, the second closed end 214a, the third closed end 216a, and the fourth closed end 214b are disposed along the second axis X2. Herein, a shape of the third closed end 216a of the third opening structure 216 and a shape of the fourth closed end 214b of the second opening structure 214' are the same. The shapes are a triangle, but not limited thereto. When the light source 300 (referring to FIG. 1B) emits the light L1 and the light L2, the light L1 and the light L2 are incident to the light guide body 210, and is reflected and/or totally reflected by the first closed end 212a, the second closed end 214a, the third closed end 216a, and the fourth closed end 214b, so that light is not mixed in the light guide regions S1 and S2, and the light guide regions S1 and S2 may be displayed in different colors.

Figure 2C:
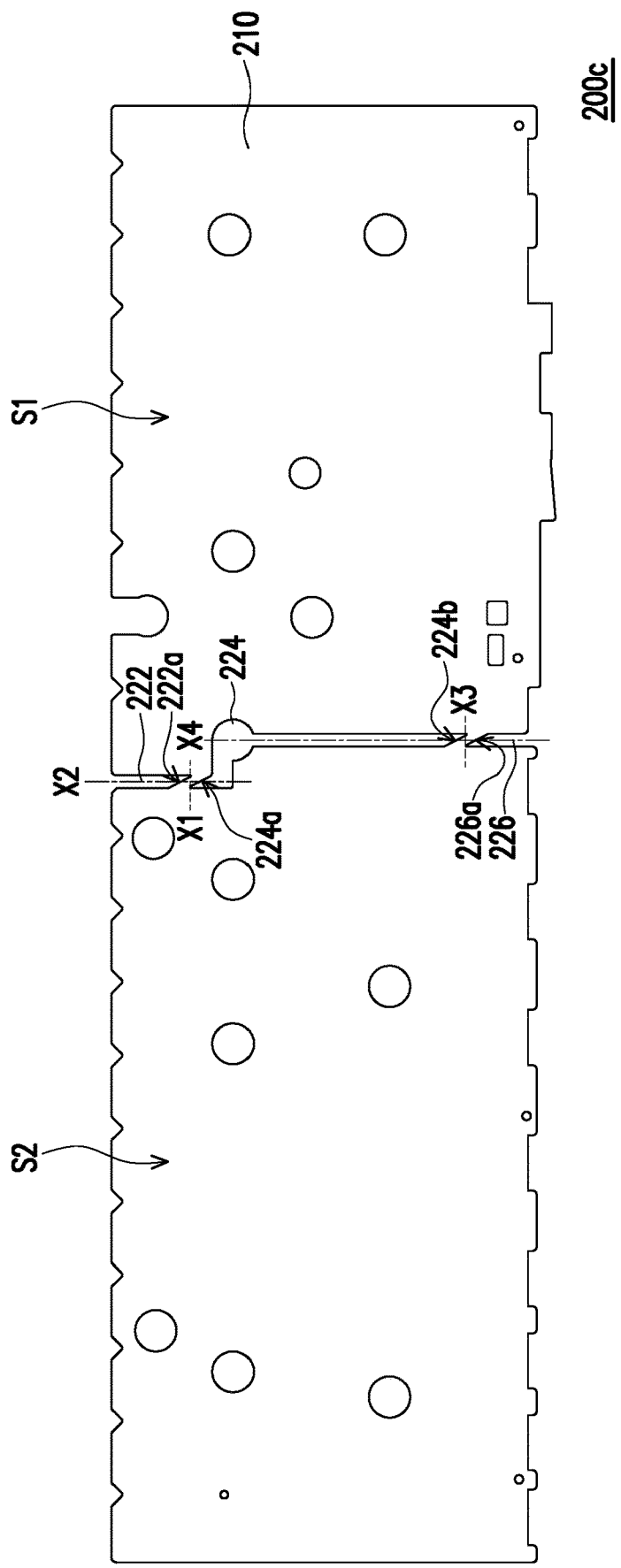
FIG. 2C is a schematic top view of a light guide plate according to another embodiment of the present invention.

FIG. 2C is a schematic top view of a light guide plate according to another embodiment of the present invention. Referring to both FIG. 2B and FIG. 2C, a light guide plate 200c in this embodiment is similar to the light guide plate 200b in FIG. 2B. A main difference between the light guide plate 200c and the light guide plate 200b lies in that a first closed end 222a of a first opening structure 222 in this embodiment is disposed parallel to a second closed end 224a of a second opening structure 224 along a second axis X2, a third closed end 226a of a third opening structure 226 is disposed parallel to a fourth closed end 224b of the second opening structure 224 along a fourth axis X4, and the fourth axis X4 is parallel to the second axis X2. Herein, a shape of the first closed end 222a of the first opening structure 222 and a shape of the second closed end 224a of the second opening structure 224 are the same. The shapes are an oblique surface, but not limited thereto. A shape of the third closed end 226a of the third opening structure 226 and a shape of the fourth closed end 224b of the second opening structure 224 are the same. The shapes are an oblique surface, but not limited thereto.

Figure 2D:
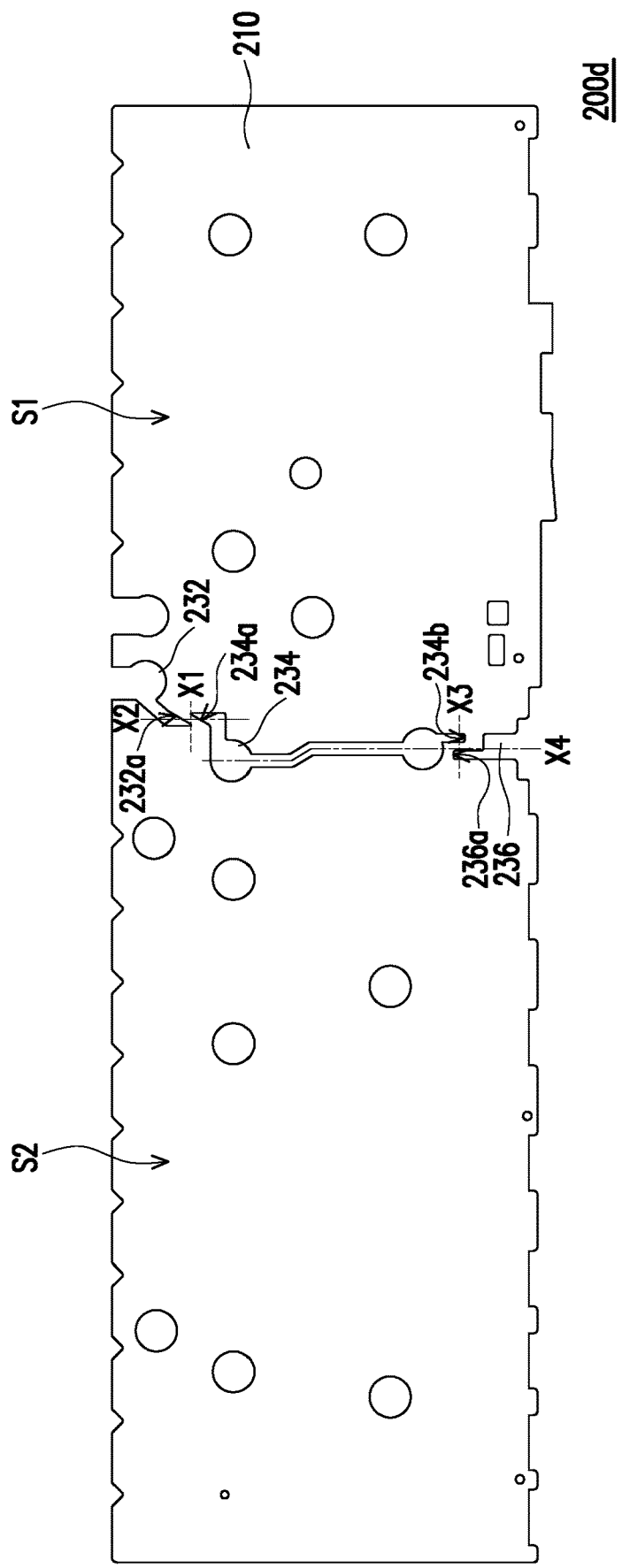
FIG. 2D is a schematic top view of a light guide plate according to another embodiment of the present invention.

FIG. 2D is a schematic top view of a light guide plate according to another embodiment of the present invention. Referring to both FIG. 2C and FIG. 2D, a light guide plate 200d in this embodiment is similar to the light guide plate 200c in FIG. 2C. A main difference between the light guide plate 200d and the light guide plate 200c lies in that in this embodiment, a shape of a first closed end 232a of a first opening structure 232 and a shape of a second closed end 234a of a second opening structure 234 are the same. The shapes are an oblique surface, but not limited thereto. A shape of a third closed end 236a of a third opening structure 236 and a shape of a fourth closed end 234b of the second opening structure 234 are the same. The shapes are an L-shape, but not limited thereto.

Figure 2E:
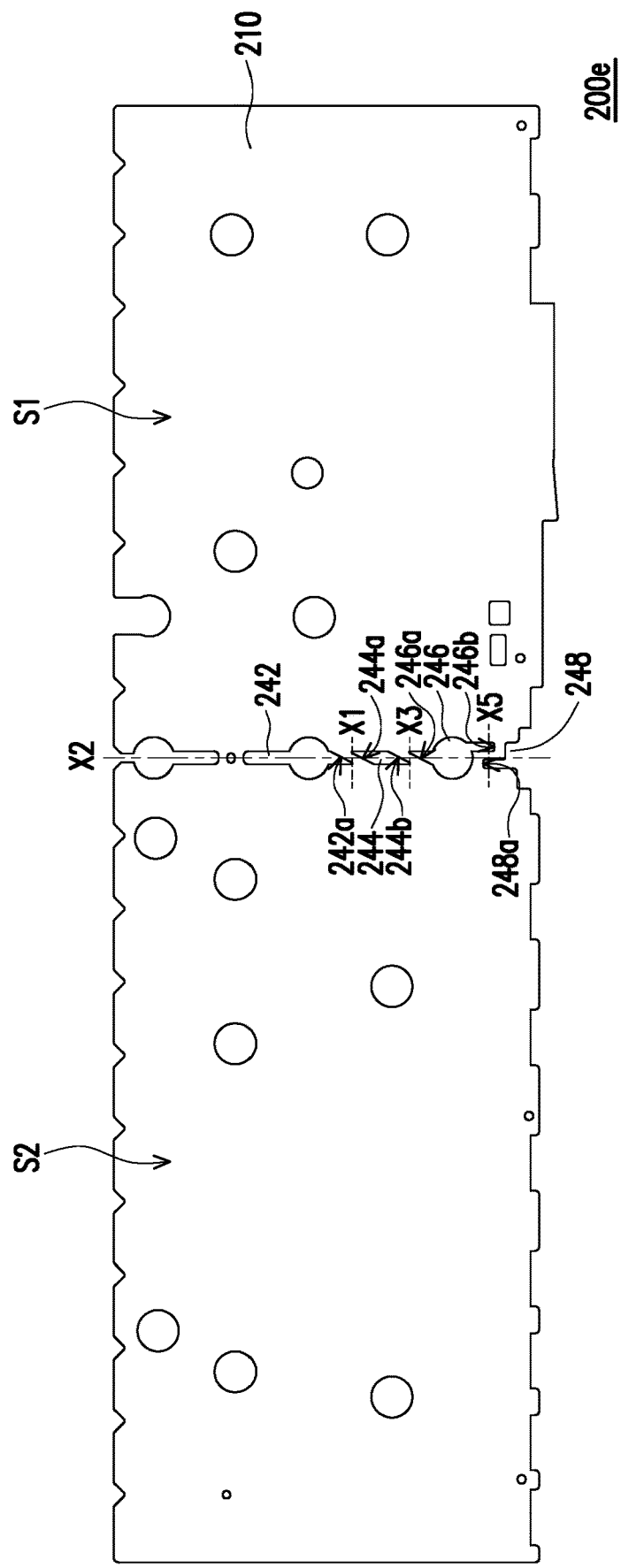
FIG. 2E is a schematic top view of a light guide plate according to another embodiment of the present invention.

FIG. 2E is a schematic top view of a light guide plate according to another embodiment of the present invention. Referring to both FIG. 2C and FIG. 2E, a light guide plate 200e in this embodiment is similar to the light guide plate 200c in FIG. 2C. A main difference between the light guide plate 200e and the light guide plate 200c lies in that the light guide plate 200e in this embodiment further includes at least one fourth opening structure 248 (where only one fourth opening structure 248 is schematically drawn in FIG. 2E), passing through the light guide body 210 and including at least one fifth closed end 248a (where only one fifth closed end 248a is schematically drawn in FIG. 2E). A third opening structure 246 further includes at least one sixth closed end 246b (where only one sixth closed end 246b is schematically drawn in FIG. 2E). The sixth closed end 246b is disposed parallel to the fifth closed end 248a on a second axis X2, the fifth closed end 248a partially overlaps the sixth closed end 246b on at least one axis (that is, a fifth axis X5) (where only one fifth axis X5 is schematically drawn in FIG. 2E), and the fifth axis X5 is parallel to a third axis X3. A third closed end 246a and the sixth closed end 246b are respectively located at two ends of the third opening structure 246. Herein, a shape of a first closed end 242a of a first opening structure 242 and a shape of a second closed end 244a of a second opening structure 244 are the same. The shapes are an oblique surface, but not limited thereto. A shape of the third closed end 246a of the third opening structure 246 and a shape of a fourth closed end 244b of the second opening structure 244 are the same. The shapes are an oblique surface, but not limited thereto. A shape of the fifth closed end 248a of the fourth opening structure 248 and a shape of the sixth closed end 246b of the third opening structure 246 are the same. The shapes are an L-shape, but not limited thereto.

Figure 2F:
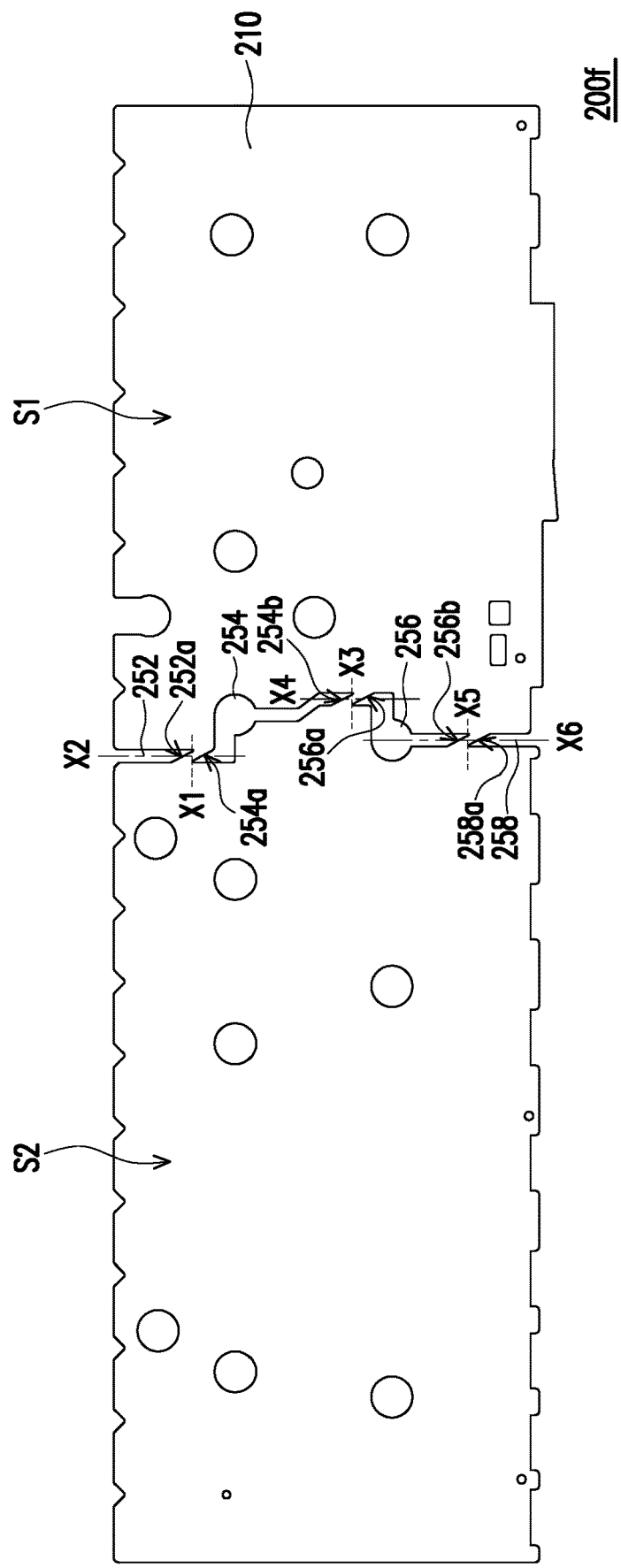
FIG. 2F is a schematic top view of a light guide plate according to another embodiment of the present invention.

FIG. 2F is a schematic top view of a light guide plate according to another embodiment of the present invention. Referring to both FIG. 2C and FIG. 2F, a light guide plate 200f in this embodiment is similar to the light guide plate 200c in FIG. 2C. A main difference between the light guide plate 200f and the light guide plate 200c lies in that the light guide plate 200f in this embodiment further includes at least one fourth opening structure 258 (where only one fourth opening structure 258 is schematically drawn in FIG. 2F), passing through the light guide body 210 and including at least one fifth closed end 258a (where only one fifth closed end 258a is schematically drawn in FIG. 2F). A third opening structure 256 further includes at least one sixth closed end 256b (where only one sixth closed end 256b is schematically drawn in FIG. 2F). The sixth closed end 256b is parallel to the fifth closed end 258a on at least one sixth axis X6 (where only one sixth axis X6 is schematically drawn in FIG. 2F). The fifth closed end 258a partially overlaps the sixth closed end 256b on a fifth axis X5, and the fifth axis X5 is parallel to a third axis X3. A third closed end 256a and the sixth closed end 256b are respectively located at two ends of the third opening structure 256. The sixth axis X6 is parallel to a fourth axis X4, and the sixth axis X6 is located between a second axis X2 and the fourth axis X4. Herein, a shape of a first closed end 252a of a first opening structure 252 and a shape of a second closed end 254a of a second opening structure 254 are the same. The shapes are an oblique surface, but not limited thereto. A shape of the third closed end 256a of the third opening structure 256 and a shape of a fourth closed end 254b of the second opening structure 254 are the same. The shapes are an oblique surface, but not limited thereto. A shape of the fifth closed end 258a of the fourth opening structure 258 and a shape of the sixth closed end 256b of the third opening structure 256 are the same. The shapes are an oblique surface, but not limited thereto.

Figure 2G:
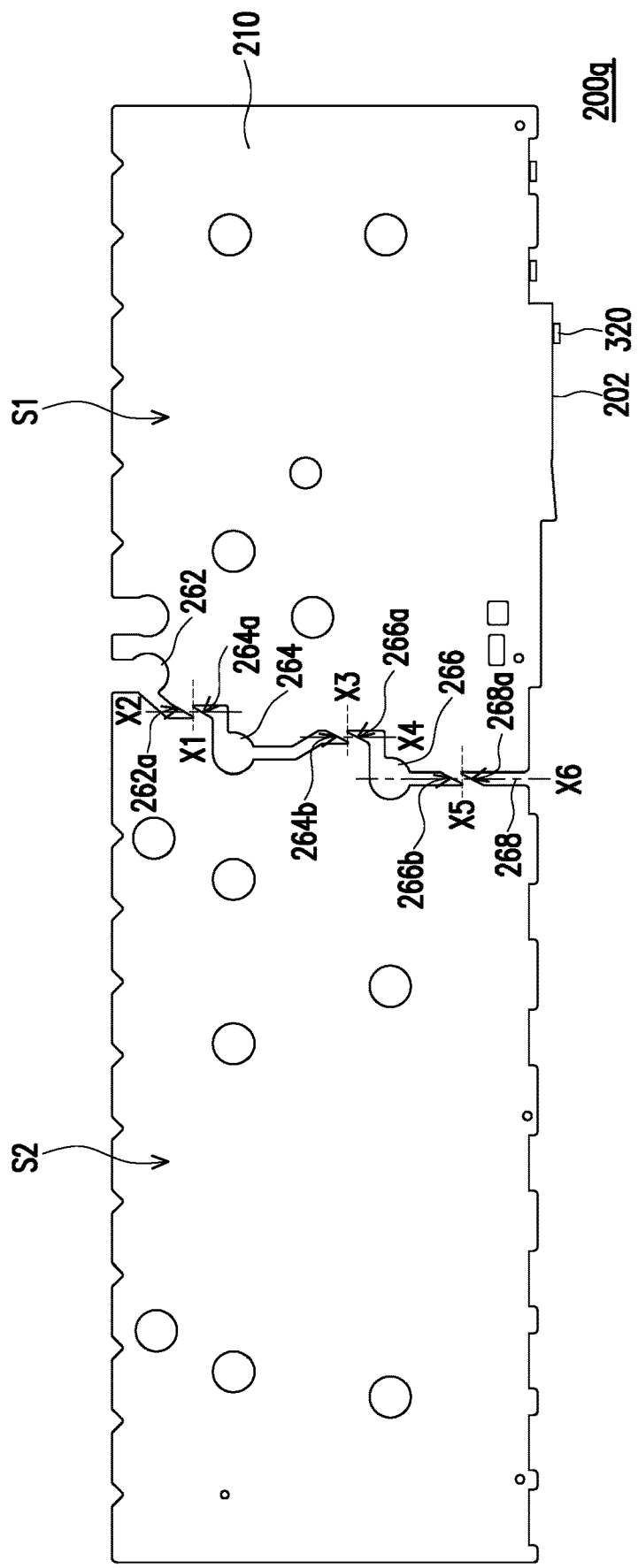
FIG. 2G is a schematic top view of a light guide plate according to another embodiment of the present invention.

FIG. 2G is a schematic top view of a light guide plate according to another embodiment of the present invention. Referring to both FIG. 2F and FIG. 2G, a light guide plate 200g in this embodiment is similar to the light guide plate 200f in FIG. 2F. A main difference between the light guide plate 200g and the light guide plate 200f lies in that a fourth axis X4 is located between a second axis X2 and a sixth axis X6. To be more specific, a third closed end 266a and a fourth closed end 264b in this embodiment are along the fourth axis X4, a first closed end 262a and a second closed end 264a are along the second axis X2, a fifth closed end 268a and a sixth closed end 266b are along the sixth axis X6, and the fourth axis X4 is located between the second axis X2 and the sixth axis X6. Herein, a shape of the first closed end 262a of a first opening structure 262 and a shape of the second closed end 264a of a second opening structure 264 are an oblique surface, but not limited thereto. A shape of the third closed end 266a of a third opening structure 266 and a shape of the fourth closed end 264b of a second opening structure 264 are an oblique surface, but not limited thereto. A shape of the fifth closed end 268a of a fourth opening structure 268 and a shape of the sixth closed end 266b of the third opening structure 266 are an oblique surface, but not limited thereto. In this embodiment, the side of the light guide plate 200g comprises a protrusion 202, and the light emitting diode 320 is disposed beside the protrusion 202 of the side of the light guide plate 200g.

Figure 2H:
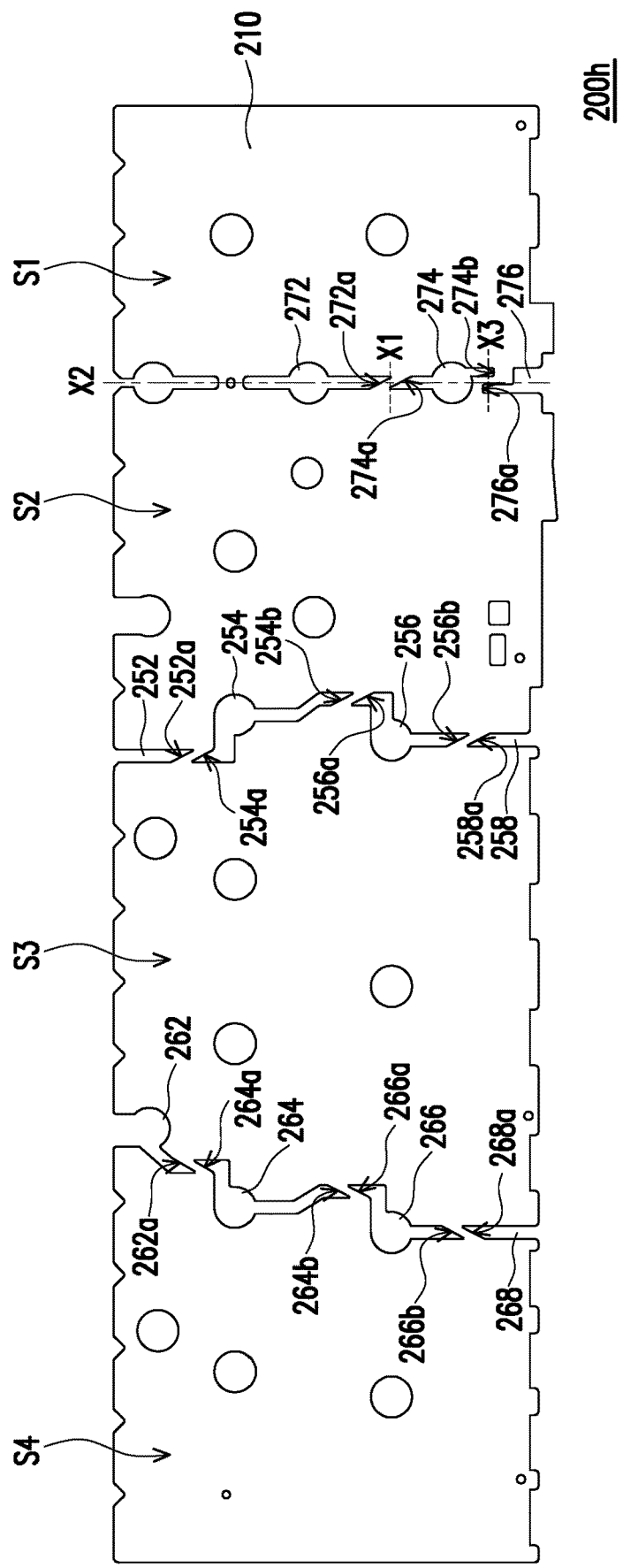
FIG. 2H is a schematic top view of a light guide plate according to another embodiment of the present invention.
Figure 21:
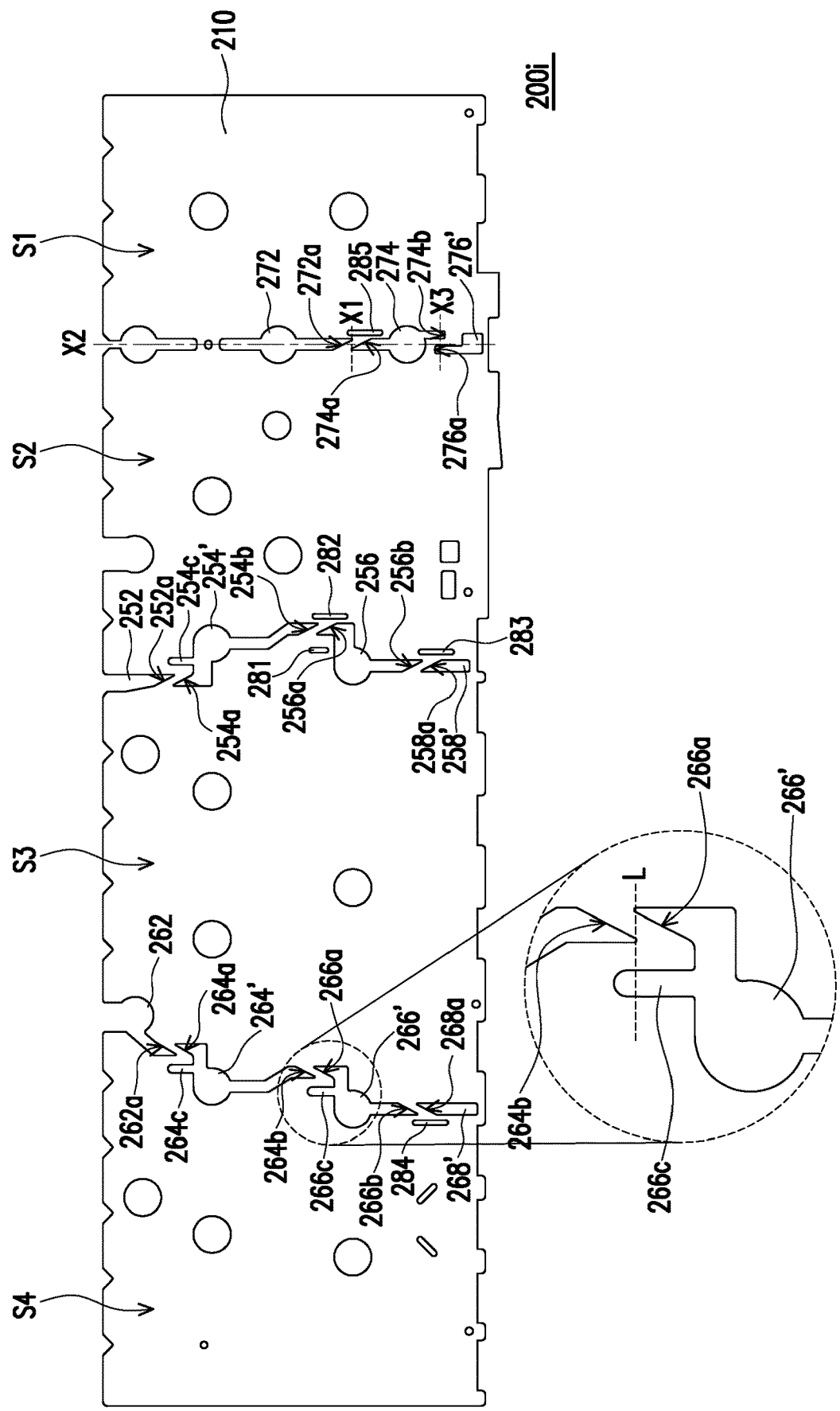

FIG. 2H is a schematic top view of a light guide plate according to another embodiment of the present invention. Referring to FIG. 2H, in this embodiment, a light guide plate 200h includes a light guide body 210, and first opening structures 252, 262, and 272, second opening structures 254, 264, and 274, third opening structure 256, 266, and 276, and fourth opening structures 258 and 268 that divide the light guide body 210 into light guide regions S1, S2, S3, and S4. That is, for an input apparatus using the light guide plate 200h in this embodiment, if the light emitting diodes 310, 320, 330, and 340 (referring to FIG. 1B) of the light source 300 (referring to FIG. 1B) may respectively emit different light of different colors, the light guide regions S1, S2, S3, and S4 of the light guide plate 200h may be displayed in four different colors, and a light mixing phenomenon is prevented.

Herein, for specific structures of the first opening structures 252 and 262, the second opening structures 254 and 264, the third opening structures 256 and 266, and the fourth opening structures 258 and 268, reference may be made to descriptions of FIG. 2F and FIG. 2G. Details are not described herein again. A first closed end 272a, a second closed end 274a, a third closed end 276a, and a fourth closed end 274b are disposed parallel to each other along a second axis X2. The first closed end 272a partially overlaps the second closed end 274a on a first axis X1, and the third closed end 276a partially overlaps the fourth closed end 274b on a third axis X3. Herein, a shape of the first closed end 272a of the first opening structure 272 and a shape of the second closed end 274a of the second opening structure 274 are the same. The shapes are an oblique surface, but not limited thereto. A shape of the third closed end 276a of the third opening structure 276 and a shape of the fourth closed end 274b of the second opening structure 274 are the same. The shapes are an L-shape, but not limited thereto.

FIG. 2I is a schematic top view of a light guide plate according to another embodiment of the present invention. Referring to both FIG. 2H and FIG. 2I, a light guide plate 200i in this embodiment is similar to the light guide plate 200h in FIG. 2H. A main difference between the light guide plate 200i and the light guide plate 200h lies in that the structures of the second opening structures 254', 264', the third opening structures 266', 276' and the fourth opening structures 258', 268' of the present embodiment are different from the structures of the second opening structures 254, 264, the third opening structures 266, 276 and the fourth opening structures 258, 268.

In detail, the second opening structures 254', 264' further include reinforcing closed end 254c, 264c, respectively, wherein the reinforcing closed end 254c extends parallel to the second axis X2 and is located at a side of a boundary between the first closed end 252a and the second closed end 254a, and the reinforcing closed end 264c extends parallel to the second axis X2 and is located at a side of a boundary between the first closed end 262a and the second closed end 264a. The third opening structure 266' further includes a reinforcing closed end 266c extends parallel to the second axis X2 and is located at a side of a boundary between the third closed end 266a and the fourth closed end 264b. The reinforcing closed ends 254c, 264c shield the boundary between the first closed ends 252a, 262a and the second closed ends 254a, 264a to enhance the local area to refract light to avoid dark areas. The reinforcing closed end 266c shields the boundary between the third closed end 266a and the fourth closed end 264b to enhance the local area to refract light to avoid dark areas. The third opening structure 276' and the fourth opening structures 258', 268' do not extend to the edge of the light guide body 210, so that one end of the third opening structure 276' relative to the third closed end 276a and one end of the fourth opening structures 258', 268' relative to the fifth closed end 258a, 268a are closed ends rather than open ends.

In addition, the light guide plates 200i of the embodiment further includes at least one reinforcing opening structure (where five reinforcing opening structures 281, 282, 283, 284, 285 are schematically drawn in FIG. 2I). The reinforcing opening structures 281, 282 are respectively disposed on opposite sides of the boundary between the third closed end 256a and the fourth closed end 254b to enhance the local area to refract light to avoid dark areas. The reinforcing opening structure 283 is disposed at a side of the boundary between the fifth closed end 258a and the sixed closed end 256b to enhance the local area to refract light to avoid dark areas. The reinforcing opening structure 284 is disposed at a side of the boundary between the fifth closed end 268a and the sixed closed end 266b to enhance the local area to refract light to avoid dark areas. The reinforcing opening structure 285 is disposed at a side of the boundary between the first closed end 272a and the second closed end 274a to enhance the local area to refract light to avoid dark areas.

Moreover, referring to the partial enlarged portion of FIG. 2I, in an embodiment, the third closed end 266a and the reinforcing closed end 266c partially overlaps the fourth closed end 264b along a reference line L which is parallel to the axis X1 so as to enhance the local area to refract light and avoid the mixing of different colors of light between the neighboring regions. As shown in the partial enlarged view, the reinforcing closed end 266c could be longer than the third closed end 266a in their respective extending directions, such that the reinforcing closed end 266c has a greater portion overlapping the fourth closed end 264b which extends beyond the reference line L, while a pointed end of the third closed end 266a may be aligned with the reference line L. However, as long as a portion (e.g., a sharp or curved corner facing towards the fourth closed end 264b) of the third closed end 266a and the fourth closed end 264b are located on the same line that extends in a direction parallel to the first axis X1 (for example, the line L shown in FIG. 2I), the third closed end 266a can be considered as partially overlapping the fourth closed end 264b along the first axis.

It is noted that the third closed end 266a and the reinforcing closed end 266c which might be two branches of the opening structure 266' are asymmetrically arranged on the respective sides of the fourth closed end 264b, and the shape of the third closed end 266a could be different from the shape of the reinforcing closed end 266c. In an embodiment, as long as at least one of the third closed 266a and the reinforcing closed end 266c partially overlaps the fourth closed end 264b along the line L, the light mixing phenomenon can be reduced between the neighboring light guide regions.

It should be noted that the light guide plates 200a, 200b, 200c, 200d, 200e, 200f, 200g, 200h, and 200i in the embodiments do not limit a quantity (but two or more is at least needed) and structural forms of opening structures, which shall fall within the protection scope of the present invention, provided that closed ends that face each other of two opposite opening structures are parallel to each other, overlap on an axis, and are disposed along another axis perpendicular to the axis. A shape of the closed end may be an oblique surface, a triangle, an L-shape, or another suitable shape. Any shape suitable for reflecting, refracting, and/or totally reflecting light shall fall within the protection scope of the present invention.

Figure 3A:
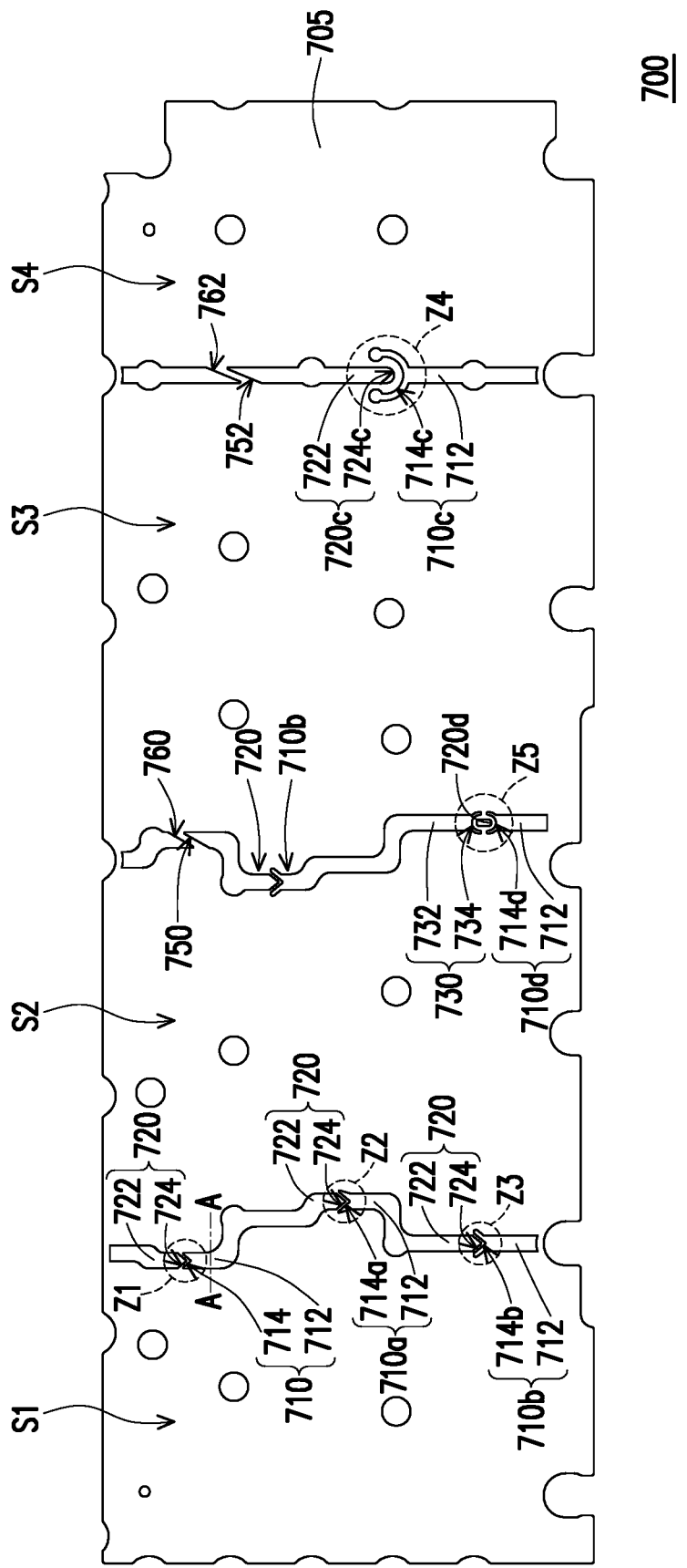
FIG. 3A is a schematic top view of a backlight module which includes a light guide plate according to another embodiment of the present invention.

FIG. 3A is a schematic top view of a light guide plate according to another embodiment of the present invention. Referring to FIG. 3A, the light guide plate 700 at least includes a light guide body 705, first opening structures 710, 710a-740d, 750 and 752 and second opening structures 720, 720c, 720d, 760 and 762. The light guide body 705 includes light guide regions S1, S2, S3, and S4.

The light guide plate 700 in this embodiment is specifically a single-sheet of the light guide plate divided, by disposing of the first opening structures 710, 710a-740d, 750, 752 and the second opening structures 720, 720c, 720d, 760, 762, into four regions that are partially connected with one another. The backlight module 20 of the input apparatus 10 (as illustrated in FIG. 1B) using the light guide plate 700 of this embodiment can provide the effect of the reflection or totally reflection of light when the light emitted from the light source is incident to the first opening structures 710, 710a-740d, 750 and 752 and the second opening structures 720, 720c, 720d, 760 and 762, so that the neighboring light guide regions S1, S2, S3, and S4 can be displayed in different colors, and a light mixing phenomenon between the adjacent light guide regions is alleviated. In an embodiment, the first opening structures 710, 710a-740d, 750 and 752 and the second opening structures 720, 720c, 720d, 760 and 762 may be arranged corresponding to positions between two adjacent keycaps of the keycap layer 100 shown in FIG. 1B. At least one of the first opening structures 710, 710a-740d, 750 and 752 and the second opening structures 720, 720c, 720d, 760 and 762 is, for example, located underneath a space defined by two adjacent keycaps of the keycap layer 100.

Specifically, the first opening structures 710, 710a, and 710b and the second opening structures 720 are disposed between the light guide regions S1 and S2. In an embodiment, each of the first opening structures 710, 710a, and 710b is spaced apart from the corresponding second opening structure 720 to divide a part of the light guide body 705 into the light guide regions S1 and S2, while at least a portion of the light guide body 705 remains between the light guide regions S1 and S2.

In addition, the first opening structures 750, 710b, and 710d and the second opening structures 760, 720, and 720d are disposed between the light guide regions S2 and S3. In an embodiment, the first opening structures 750, 710b, and 710d are spaced apart from the corresponding second opening structures 760, 720, and 720d to divide a part of the light guide body 705 into the light guide regions S2 and S3 with at least a portion of the light guide body 705 remains therebetween.

Moreover, the first opening structures 752 and 710c and the second opening structures 762 and 720c are disposed between the light guide regions S3 and S4. In an embodiment, the first opening structures 752 and 710c are spaced apart from the corresponding second opening structures 762 and 720c to divide a part of the light guide body 705 into the light guide regions S3 and S4 with at least a portion of the light guide body 705 remains therebetween.

It is noted that in FIG. 3A, each of the first opening structures 750 and 752 is similar to the first opening structure 212 shown in FIG. 2A, and each of the second opening structures 760 and 762 is similar to the second opening structure 214 shown in FIG. 2A, which are not repeatedly described hereinafter. The detail descriptions of the first opening structures 710, and 710a-740d and the second opening structures 720, 720c, and 720d are explained below.

FIGS. 3B-3F are partially enlarged schematic views of zones Z1-Z5 of FIG. 3A. Referring to FIGS. 3A and 3B together, the first opening structure 710 passes through the light guide body 705 (FIG. 3A) and includes a first closed end 714 and an extending portion 712 connected to the first closed end 714. In the embodiment, the first closed end 714 has two first branches 716, and a contour of the first closed end 714 is, for example, a concaved V shape.

The second opening structure 720 passes through the light guide body 705 and includes a second closed end 724 and an extending portion 722 connected to the second closed end 724. A width of the second closed end 724 along a first axis X1 (FIG. 3B) is different from a width of the extending portion 712 along the first axis X1. In an embodiment, a contour of the second closed end 724 is a convex V shape that may correspond to the contour of the first closed end 714, such that the width of the second closed end 724 along the first axis X1 is less that the width of the extending portion 712 along the first axis X1. In addition, the contour of the first closed end 714 (concaved V shape) is, for example, conformal to the contour of the second closed end 724 (convex V shape), but it is not limited thereto. In an embodiment, the width of the first closed end 714 in a direction parallel to the axis X1 could be substantially equal to that of the second closed end 724.

As shown in FIG. 3B, the first closed end 714 and the second closed end 724 are disposed along a second axis X2. The first closed end 714 partially overlaps the second closed end 724 along the first axis X1, and the two first branches 716 of the first closed end 714 are located on the respective sides (e.g., the left side and the right side) of the second closed end 724 along the second axis X2. In an embodiment, the first axis X1 is substantially perpendicular to the second axis X2. The first closed end 714 and the second closed end 724 face each other and are suitable for refracting and reflecting light, such that light can be reflected, by the first closed end 714 and/or the second closed end 724, back to the originated light guide region which the reflected light is emitted from without light leakage to the adjacent light guide region.

Referring to FIG. 3C, the main difference between FIG. 3B and FIG. 3C is the configuration of the two first branches of the first closed end. In FIG. 3B, a distance between the two first branches 716 of the first closed end 714 along the first axis X1 is the same as the width of the extending portion 712 along the first axis X1; in FIG. 3C, a distance between the two first branches 716a of the first closed end 714a along the first axis X1 is greater than the width of the extending portion 712 along the first axis X1. In addition, the two first branches 716a of the first closed end 714a overlap at least half of the second closed end 724 along the second axis X2. In an embodiment, the width of the first closed end 714a in the direction parallel to the axis X1 could be greater than that of the second closed end 724, and the first branch 716a might extend further closer to the extending portion 722, thereby preventing the light from traveling through the neighboring light guide regions.

Referring to FIG. 3D, the main difference between FIG. 3C and FIG. 3D is that the shape of the first branch 716a of the first closed end 714a is tapered toward its curved or sharp end in FIG. 3C, while the shape of the first branch 716b of the first closed end 714b has the constant width along its extending direction toward the rounded end in FIG. 3D.

Referring to FIG. 3E, the main difference between FIG. 3D and FIG. 3E is that in FIG. 3D, the contour of the first closed end 714b is a concaved V shape, and the contour of the second closed end 724 is a convex V shape; in FIG. 3E, the contour of the first closed end 714c is a concaved U shape, and the contour of the second closed end 724c is a convex U shape. In addition, the two first branches 716c of the first closed end 714c partially overlap the extending portion 722 along the first axis X1. That is, the two first branches 716c of the first closed end 714c projecting toward the extending portion 722 are located on the two sides (e.g., the left side and the right side) of the extending portion 722, so that the second closed end 724c and a part of the extending portion 722 are arranged between the first branches 716c. Moreover, the first branch 716c of the first closed end 714c may have an enlarged rounded shape at its end, such as a circular shape.

Referring to FIG. 3A and FIG. 3F together, in the embodiment, the light guide plate 705 (FIG. 3A) further includes a third opening structure 730. The third opening structure 730 passes through the light guide body 705 and includes a third closed end 734 and an extending portion 732 connected to the third closed end 734. The second opening structure 720d is located between the first opening structure 710d and the third opening structure 730. The second opening structure 720d has two second closed ends 724d opposite to each other, and the two second closed ends 724d face towards the first closed end 714d and the third closed end 734, respectively. The contours of the closed ends 714d and 724d are, for example, U-shaped. In an embodiment, the first branches 716d overlapping one of the second closed ends 724d along the first axis X1 may extend further toward the third closed end 734.

The third closed end 734 partially overlaps the other of the second closed ends 724 along a third axis X3 parallel to the first axis X1. In an embodiment, the third closed end 734 has two second branches 736 projecting along the second axis X2 and being located on the two sides of the second closed end 724d.

Figure 3I:
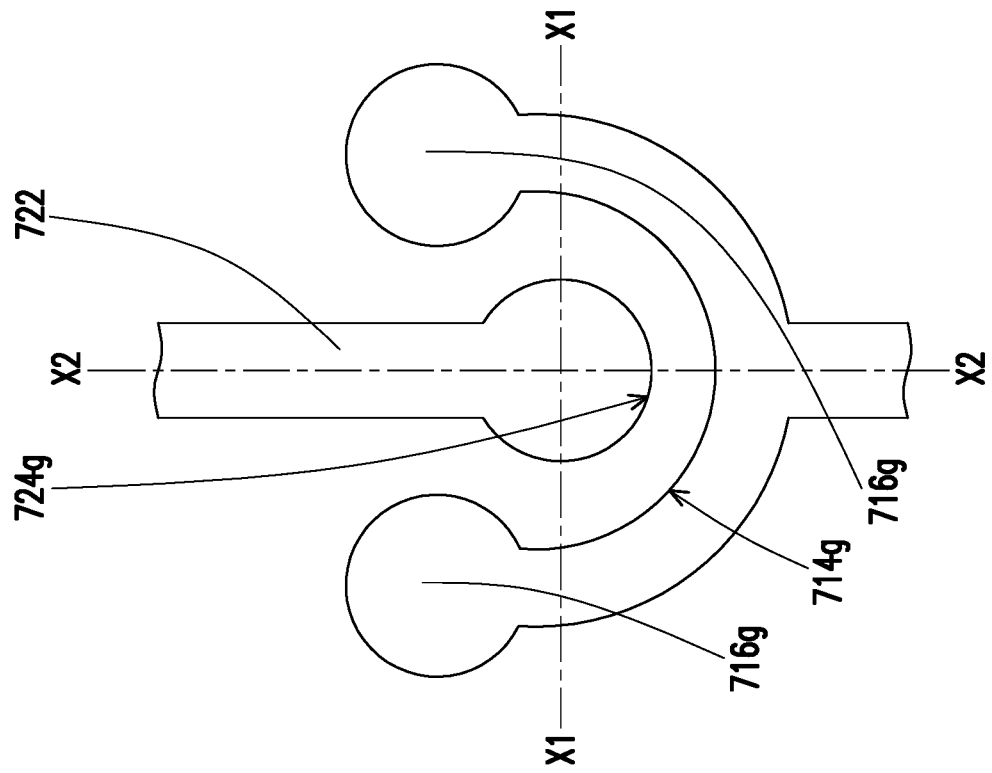
Figure 3H:
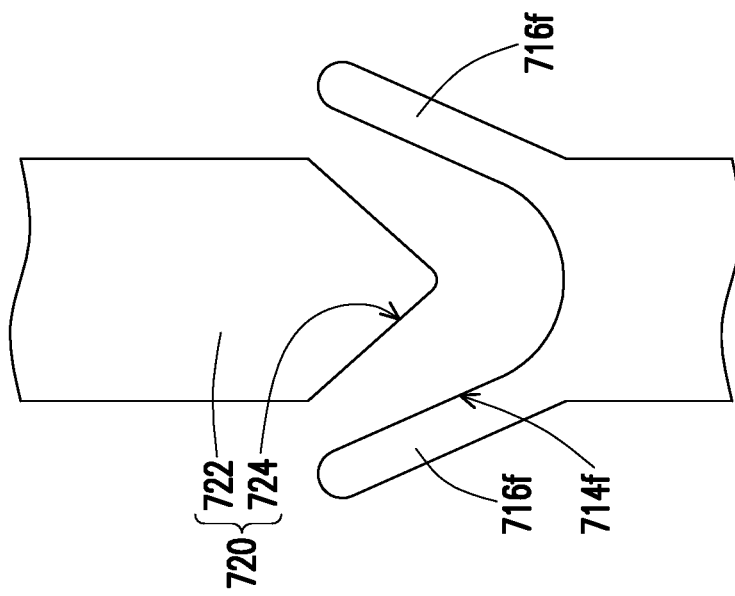

FIGS. 3G-3I are partially enlarged schematic views of a light guide plate according to other embodiments of the present invention. Referring to FIG. 3G, the main difference between FIG. 3B and FIG. 3G is the contours of the first closed end and the second closed end. In FIG. 3B, the first closed end 714 has a concave V shape, and the second closed end 724 has a convex V shape. In FIG. 3G, the first closed end 714e has a concave U shape, and the second closed end 724e has a narrow strip shape. The second closed end 724e is partially surrounded by the first closed end 714e, and the second closed end 724e could have an outline corresponding to the arrangement of the first closed end 714e. Moreover, the two first branches 716e of the first closed end 714e and the second closed end 724e have rounded shapes.

Referring to FIG. 3H, a contour of the first closed end 714f is not conformal to a contour of the second closed end 724. In an embodiment, the contour of the first closed end 714f is, for example, concaved U-shaped, and that of the second closed end 724 is convex V-shaped. In addition, the two first branches 716f of the first closed end 714f have rounded shapes, and the width of the first closed end 714f could be wider than that of the second closed end 724.

Referring to FIG. 3I, the first closed end 714g and the second closed end 724g are arranged along the second axis X2, and the two branches 716g of the first closed end 714g are located on two sides of the second closed end 724g and a part of the extending portion 722. In addition, the two branches 716g of the first closed end 714g respectively have enlarged ends, e.g., circular-shaped ends, and the second closed end 724g may have an enlarged circular shape. In an embodiment, a width of the second closed end 724g along the first axis X1 is greater than a width of the extending portion 722 along the first axis X1.

Figure 4A:
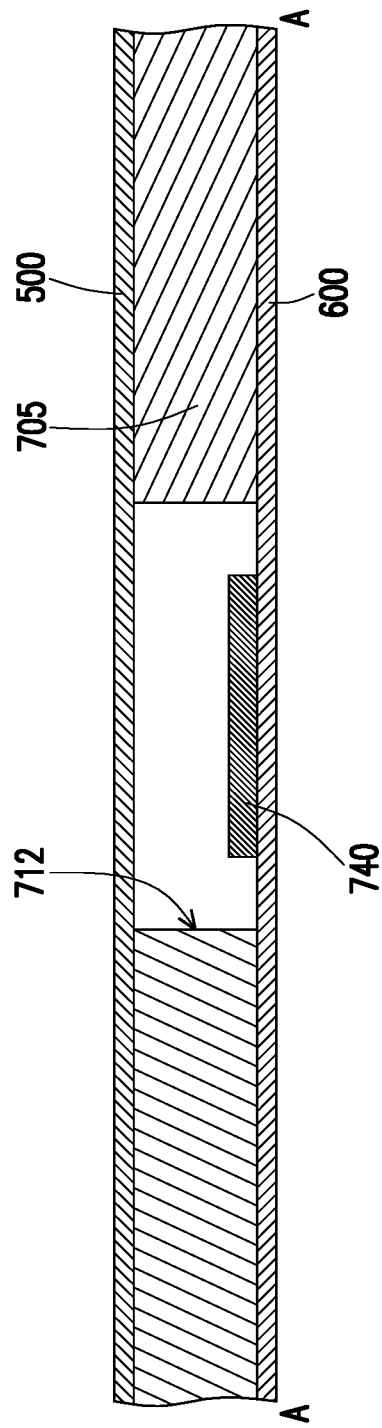
FIG. 4A is a partially enlarged cross-sectional view of the light guide plate along line A-A of FIG. 3A, with the mask layer and the reflection layer.

FIG. 4A is a partially enlarged cross-sectional view of the light guide plate along line A-A of FIG. 3A, with the mask layer and the reflection layer. It is noted that the extending portion 712 of the first opening structure 710 in the light guide plate 700 is used as an example for schematic illustration, the same or similar arrangement can be applied to other extending portions or opening structures in other embodiments.

Referring to FIG. 3A and FIG. 4A, the light guide body 705 is disposed between the mask layer 500 and the reflection layer 600, such that the mask layer 500 and the reflection layer 600 are respectively located above and below the first opening structure 710. In an embodiment, a light absorption member 740 is disposed in the first opening structure 710. The light absorption member 740 could be arranged on the reflection layer 600 at a position corresponding to the extending portion 712. The light absorption member 740 is, for example but not limited to, an ink layer or an adhesive layer. The light absorption member 740 is, for example, able to absorb or converge light transmitted to the extending portion 712, such that the possibility that light travels between the adjacent light guide regions can be further reduced. Therefore, light with different colors are not mixed in the neighboring light guide regions. Certainly, the light absorbing member 740 might be arranged on the mask layer 500 at a position corresponding to the extending portion 712 in another embodiment. Because of the arrangement of the opening structures with the overlapping closed ends as elaborated in the above embodiments, the mixing of different colors of light between the neighboring light guide regions could be alleviated without any opaque material disposed within the closed end. Thus, the mask layer 500 may not be joined with the reflection layer 600 even if the adhesive layer (the light absorption member 740) is disposed in the first opening structure 710.

Figure 4B:
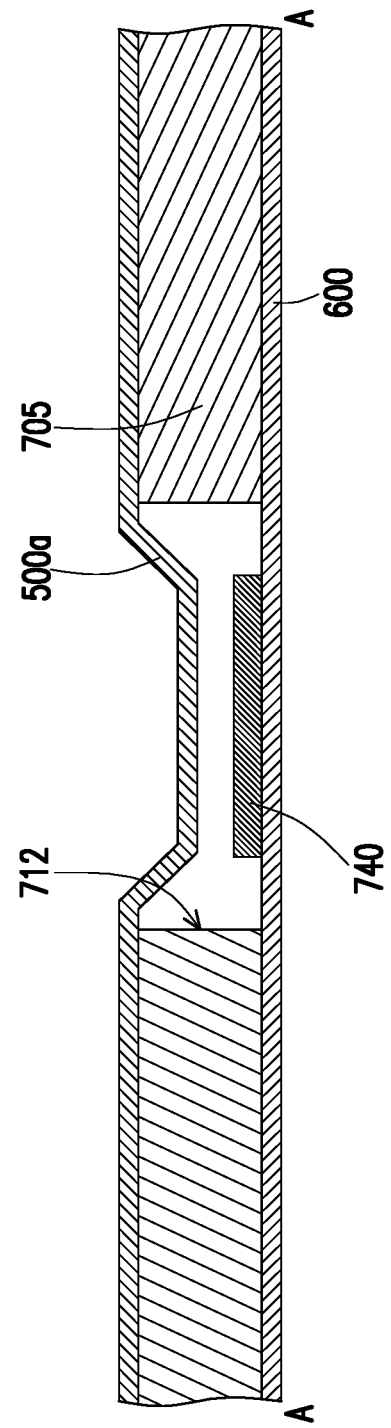
FIGS. 4B-4E are partially enlarged cross-sectional views of backlight modules according to other embodiments of the present invention.

FIGS. 4B-4E are partially enlarged cross-sectional views of backlight modules according to other embodiments of the present invention. Referring to FIG. 4B, in an embodiment, a part of the mask layer 500a could extend into the extending portion 712, such that light transmitted to the extending portion 712 can be partially absorbed or blocked by the extended part of the mask layer 500a to reduce the possibility of the light mixing or leakage. The extended part of the mask layer 500a can be shaped by punching or pressing a flat masking layer, but it is not limited thereto.

In an embodiment, the light absorption member 740 is disposed on the reflection layer 600 and faces the extended part of the mask layer 500a. In another embodiment, the light absorption member 740 can be disposed on the extended part of the mask layer 500, or on both of the mask layer 500a and the reflection layer 600 corresponding to the extending portion 712.

Figure 4C:
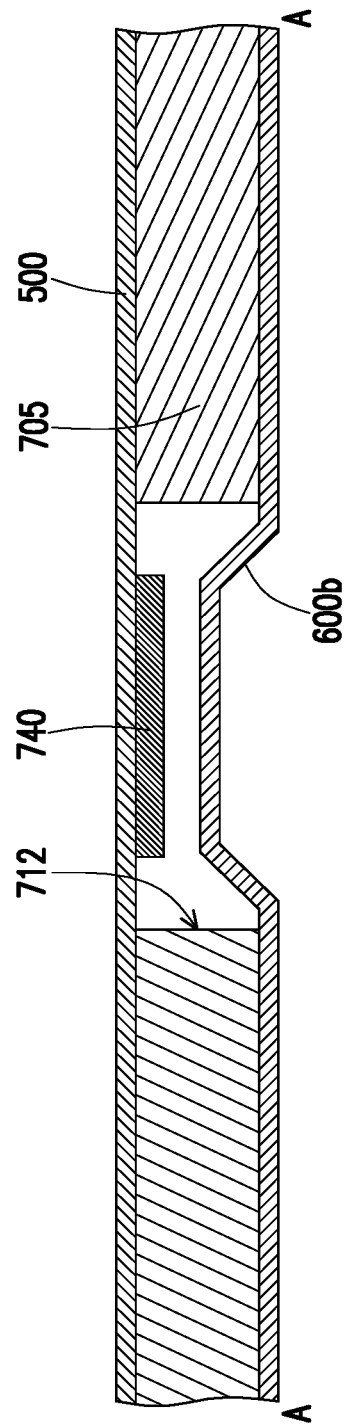

Referring to FIG. 4C, in an embodiment, a part of the reflection layer 600b extends into the extending portion 712, such that light transmitted to the extending portion 712 can be reflected by the part of the reflection layer 600b to reduce the possibility of the light mixing. Likewise, the absorption member 740 could be further disposed on at least one of the mask layer 500 and the reflection layer 600b corresponding to the extending portion 712. It is noted that a part of the reflection layer 600b would not extend into the first opening structure 710 with a narrow gap. In an embodiment, the mask layer 500 or the reflection layer 600b having a part extending into the extending portion 712 may not extend into the first branch 716 (as illustrated in FIG. 3B), as the pointed end of the first branch 716 could not provide a sufficient space for accommodating the extended part of the mask layer 500 or the reflection layer 600b. In other words, there is no opaque material disposed within the pointed end of the first branch 716. In another embodiment, the mask layer 500 or the reflection layer 600b could further extend into the first branch with an enlarged end, such as the first closed ends 714c and 714g illustrated in FIGS. 3E and 3I.

Figure 4D:
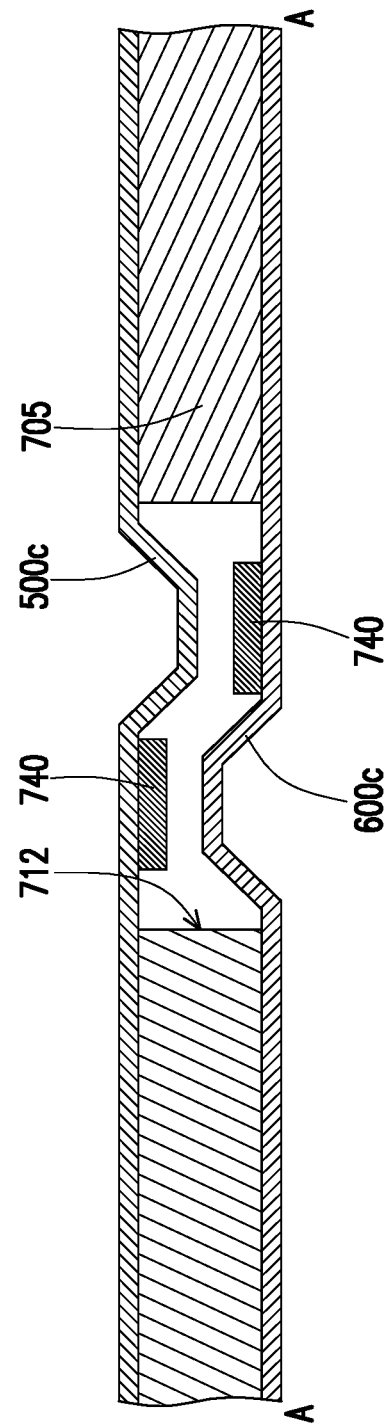

Referring to FIG. 4D, a part of the mask layer 500c extends into the extending portion 712, and a part of the reflection layer 600c extends into the extending portion 712 as well. In an embodiment, the extended parts of the mask layer 500c and the reflection layer 600c are staggered in the extending portion 712. In addition, the light absorption members 740 could be disposed in the extending portion 712 corresponding to the extended part of the mask layer 500c and the extended part of the reflection layer 600c, respectively.

Figure 4E:
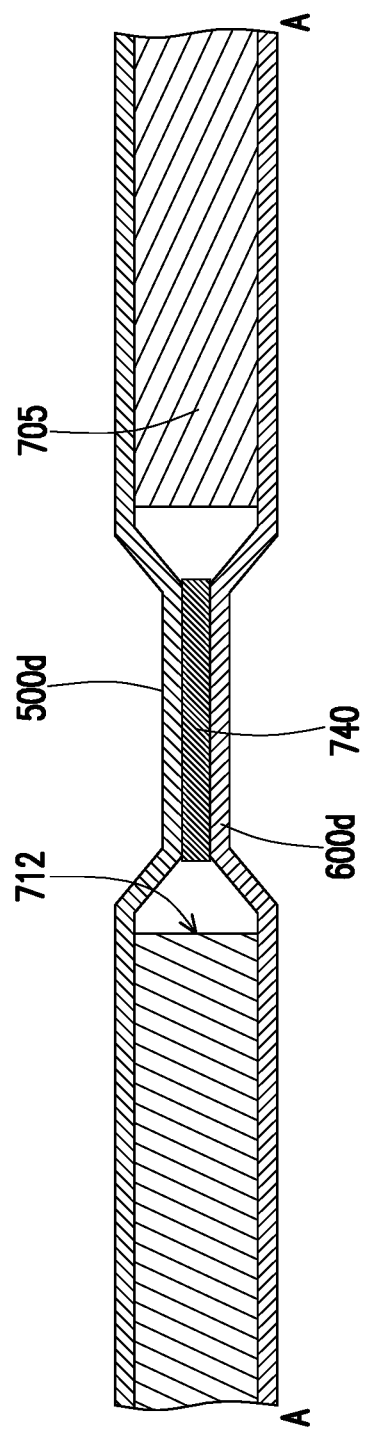

Referring to FIG. 4E, in the embodiment, a part of the mask layer 500d and a part of the reflection layer 600d extend into the extending portion 712, and the part of the mask layer 500d extending into the extending portion 712 is aligned with the part of the reflection layer 600d extending into the extending portion 712. In addition, a light absorption member 740 is disposed in the extending portion 712 and between the extended parts of the mask layer 500d and the reflection layer 600d. The light absorption member 740 can be an adhesive layer so as to adhere the mask layer 500d and the reflection layer 600d for further avoiding the light leakage.

In conclusion, in design of a light guide plate in the present invention, a first opening structure and a second opening structure are separated from each other to divide a light guide body into at least two light guide regions. That is, the light guide plate in the present invention is a single-sheet light guide plate and achieves, by disposing of opening structures, an effect that regions are divided into. In addition, the opening structures in the present invention include closed ends that can refract and reflect light. Therefore, the input apparatus using the light guide plate in the present invention can reflect or totally reflect light when a light source is incident to the closed ends of the opening structures, so that light is not mixed in neighboring light guide regions, and the neighboring light guide regions can be displayed in different colors.

Finally, it should be noted that the foregoing embodiments are merely intended to describe the technical solutions of the present invention, but not to limit the present invention. Although the present invention is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present invention.

What is claimed is:

1. A backlight module, comprising:
   a reflection layer;
   a light guide plate, disposed on the reflection layer and comprising:
      a light guide body;
      a first opening structure, passing through the light guide body and comprising a first closed end, wherein the first closed end has two first branches; and
      a second opening structure, passing through the light guide body and comprising a second closed end, wherein the first closed end and the second closed end face each other, at least one of the two first branches of the first closed end partially overlaps the second closed end along a first axis, the two first branches of the first closed end are located on two sides of the second closed end along a second axis, and the first axis is perpendicular to the second axis;
   a mask layer, wherein the light guide plate is disposed between the reflection layer and the mask layer; and
   a light absorption member, disposed at a position corresponding to the first opening structure or the second opening structure.

2. The backlight module according to claim 1, wherein the second opening structure comprises an extending portion connected to the second closed end, a width of the second closed end along the first axis is different from a width of the extending portion along the first axis, and the two first branches of the first closed end overlap at least half of the second closed end along the second axis.

3. The backlight module according to claim 2, wherein a distance between the two first branches of the first closed end along the first axis is greater than the width of the extending portion along the first axis.

4. The backlight module according to claim 2, wherein the two first branches of the first closed end partially overlap the extending portion along the first axis.

5. The backlight module according to claim 1, wherein the two first branches of the first closed end are asymmetrically located on the two sides of the second closed end along the second axis.

6. The backlight module according to claim 1, wherein the light guide plate further comprises a third opening structure passing through the light guide body and comprising a third closed end, the second closed end is located between the first closed end and the third closed end, the third closed end partially overlaps the second opening structure along a third axis parallel to the first axis, the third closed end has two second branches located on two sides of the second opening structure along the second axis.

7. The backlight module according to claim 1, wherein the first opening structure or the second opening structure comprises an extending portion connected to the first closed end or the second closed end, and the light absorption member is disposed in the extending portion.

8. The backlight module according to claim 1, wherein the first opening structure or the second opening structure comprises an extending portion connected to the first closed end or the second closed end, and at least one of the mask layer and the reflection layer extends into the extending portion.

9. The backlight module according to claim 8, wherein a part of the mask layer and a part of the reflection layer extend into the extending portion, and the part of the mask layer extending into the extending portion is staggered with the part of the reflection layer extending into the extending portion.

10. The backlight module according to claim 8, wherein a part of the mask layer and a part of the reflection layer extend into the extending portion, and the part of the mask layer extending into the extending portion is aligned with the part of the reflection layer extending into the extending portion.

11. An input apparatus, comprising:
    a keycap layer;
    a light guide plate, disposed below the keycap layer and comprising:
       a light guide body comprising two light guide regions;
       a first opening structure, passing through the light guide body and comprising a first closed end; and
       a second opening structure, passing through the light guide body and comprising a second closed end, wherein the first opening structure and the second opening structure are disposed between the two light guide regions and spaced apart from each other corresponding to positions between two adjacent keycaps of the keycap layer, the first closed end and the second closed end face each other, the first closed end partially overlaps the second closed end along a first axis, the first closed end and the second closed end are disposed along a second axis, and the first axis is perpendicular to the second axis;
    a light source disposed beside a side of the light guide plate; and
    a light absorption member, disposed at a position corresponding to the first opening structure or the second opening structure.

12. The input apparatus according to claim 11, wherein the first opening structure comprises a first extending portion connected to the first closed end, the second opening structure comprises a second extending portion connected to the second closed end, and a width of the first closed end in a direction parallel to the first axis is equal to or greater than a width of the second closed end in the direction parallel to the first axis.

13. The input apparatus according to claim 12, wherein the light absorption member is disposed in the first extending portion or the second extending portion.

14. The input apparatus according to claim 12, further comprising:
    a mask layer disposed between the keycap layer and the light guide plate; and a reflection layer disposed below the light guide plate, wherein at least one of the mask layer and the reflection layer extends into the first extending portion of the first opening structure or the second extending portion of the second opening structure.

15. The input apparatus according to claim 12, wherein the first closed end has two first branches located on two sides of the second closed end along the second axis, a width of the second closed end along the first axis is different from a width of the second extending portion along the first axis, and one of the two first branches of the first closed end overlap at least half of the second closed end along the second axis.

16. The input apparatus according to claim 15, wherein a distance between the two first branches of the first closed end along the first axis is greater than the width of the second extending portion along the first axis.

17. The input apparatus according to claim 15, wherein the two first branches of the first closed end partially overlap the second extending portion along the first axis.

18. An input apparatus, comprising:
a keycap layer;
a reflection layer, disposed below the keycap layer; and
a light guide plate, disposed between the keycap layer and the reflection layer, wherein the light guide plate comprises:
　a first light guide region;
　a second light guide region, partially connected with the first light guide region;
　a first opening structure, being disposed between the first light guide region and the second light guide region, and comprising a first extending portion and a first closed end connected to the first extending portion;
　a second opening structure, being disposed between the first light guide region and the second light guide region, and comprising a second extending portion and a second closed end connected to the second extending portion, wherein the first closed end facing the second closed end extends toward the second extending portion, the first opening structure and the second opening structure are located underneath a space between two adjacent keycaps of the keycap layer; and
　a light absorption member, disposed at a position corresponding to the first opening structure or the second opening structure.

19. The input apparatus according to claim 18, wherein the first opening structure and the second opening structure spaced apart from each other defines a junction connecting the first light guide region and the second light guide regions.

20. The input apparatus according to claim 18, wherein the first closed end has a first branch partially overlapping the second closed end along a first axis and being located on a side of the second closed end along a second axis perpendicular to the first axis, and the reflection layer is not disposed within a pointed end of the first branch.

* * * * *